US011805693B2

United States Patent
Jung

(10) Patent No.: US 11,805,693 B2
(45) Date of Patent: Oct. 31, 2023

(54) LIGHT EMITTING DISPLAY DEVICE

(71) Applicant: LG Display Co., Ltd., Seoul (KR)

(72) Inventor: In Seop Jung, Jinju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 77 days.

(21) Appl. No.: 17/517,248

(22) Filed: Nov. 2, 2021

(65) Prior Publication Data
US 2022/0181398 A1 Jun. 9, 2022

(30) Foreign Application Priority Data

Dec. 9, 2020 (KR) .................. 10-2020-0171769

(51) Int. Cl.
  *H01L 51/52* (2006.01)
  *H10K 59/35* (2023.01)
  *H10K 50/125* (2023.01)
  *H10K 50/818* (2023.01)
  *H10K 50/828* (2023.01)

(52) U.S. Cl.
  CPC ......... *H10K 59/353* (2023.02); *H10K 50/125* (2023.02); *H10K 50/818* (2023.02); *H10K 50/828* (2023.02); *H10K 59/351* (2023.02)

(58) Field of Classification Search
  CPC .. H10K 59/353; H10K 50/125; H10K 50/818; H10K 50/828; H10K 59/351; H10K 50/11; H10K 59/352; H01L 33/08; H01L 33/20; H01L 33/42
  See application file for complete search history.

(56) References Cited

U.S. PATENT DOCUMENTS

| | | | |
|---|---|---|---|
| 2005/0280008 A1* | 12/2005 | Ricks | H10K 50/852 257/79 |
| 2012/0049726 A1 | 3/2012 | Yoo et al. | |
| 2013/0070168 A1* | 3/2013 | Yokota | H01L 33/44 257/89 |
| 2015/0295205 A1* | 10/2015 | Lee | H10K 50/856 257/40 |
| 2017/0069692 A1 | 3/2017 | Lee et al. | |

FOREIGN PATENT DOCUMENTS

| | | | | |
|---|---|---|---|---|
| CN | 106856205 A | * | 6/2017 | ......... H01L 27/3206 |
| KR | 10-2012-0020087 A | | 3/2012 | |
| KR | 10-2017-0029162 A | | 3/2017 | |
| KR | 10-2019-0016287 A | | 2/2019 | |

OTHER PUBLICATIONS

English Machine Translation of Chinese Pub. No. CN 106856205 (Year: 2023).*

* cited by examiner

*Primary Examiner* — Donald L Raleigh
(74) *Attorney, Agent, or Firm* — Morgan, Lewis & Bockius LLP

(57) ABSTRACT

A light-emitting display device includes: a substrate including a first region and a second region spaced apart from each other, a first lower electrode at the first region, a second lower electrode at the second region, a first light-emitting layer having a first dopant on the first lower electrode of the first region, a second light-emitting layer on the second lower electrode of the second region, the second light-emitting layer having a second dopant different form the first dopant, the second light-emitting layer being configured to emit a light of a same color as that of the first light-emitting layer, and a common electrode on the first and second light-emitting layers, over the first and second regions.

20 Claims, 18 Drawing Sheets

LIGHT EMITTING DISPLAY DEVICE

CROSS-REFERENCE TO RELATED APPLICATION(S)

This application claims the benefit of and priority to Korean Patent Application No. 10-2020-0171769, filed on Dec. 9, 2020, the entirety of which is hereby incorporated by reference.

BACKGROUND

1. Technical Field

The present disclosure relates to a light-emitting display device, and more particularly, to a light-emitting display device in which a structure having different light-emitting layers to same color based sub-pixels is provided to prevent a change in luminance according to a change in viewing angle and to improve luminance.

2. Discussion of the Related Art

As society has recently entered the information age, the field of displays for visually displaying electrical information signals has rapidly developed. To satisfy such development, various display devices having excellent performance, such as slimness, light weight and low power consumption, have been developed and have rapidly replaced conventional cathode ray tubes (CRTs).

Among these display devices, light-emitting display devices, which do not require separate light sources, achieve compactness and clear color display, and which include light-emitting devices within a display panel, are considered as competitive applications. Because a light-emitting display device includes a light-emitting element therein, and each light-emitting element is set to be optimized for a frontal luminance, a luminance tends to decrease as a viewing angle becomes large.

SUMMARY

Accordingly, the present disclosure is directed to a light-emitting display device that substantially obviates one or more of the issues due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a light-emitting display device, including: a substrate including a first region and a second region spaced apart from each other, a first lower electrode at the first region, a second lower electrode at the second region, a first light-emitting layer having a first dopant on the first lower electrode of the first region, a second light-emitting layer on the second lower electrode of the second region, the second light-emitting layer having a second dopant different form the first dopant, the second light-emitting layer being configured to emit a light of a same color as that of the first light-emitting layer, and a common electrode on the first and second light-emitting layers, over the first and second regions.

In another aspect, there is provided a light-emitting display device, comprising: a substrate; a first sub-pixel on the substrate; a second sub-pixel on the substrate; a third sub-pixel on the substrate; a fourth sub-pixel on the substrate; a first lower electrode to a fourth lower electrode respectively on the first to fourth sub pixels; a first light-emitting layer on the first lower electrode of the first sub-pixel; a second light-emitting layer on the second lower electrode of the second region, the second light-emitting layer having an electroluminescence peak wavelength that is 1 nm to 40 nm or less different from that of the first light-emitting layer; a third light-emitting layer and a fourth light-emitting layer respectively on the third lower electrode and the fourth lower electrode, each of the third and fourth emitting layers having an electroluminescence peak wavelength that is 50 nm or more different from the electroluminescence peak wavelengths of the first and second light-emitting layers; and a common electrode on the first to fourth light-emitting layers, commonly over the first to fourth sub-pixels.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages may be discussed below in conjunction with embodiments of the disclosure. It is to be understood that both the foregoing general description and the following detailed description of the present disclosure may be examples and explanatory, and may be intended to provide further explanation of the disclosure as claimed.

BRIEF DESCRIPTION OF THE DRAWINGS

The accompanying drawings, that may be included to provide a further understanding of the disclosure and may be incorporated in and constitute a part of this disclosure, illustrate embodiments of the disclosure and together with the description serve to explain various principles of the disclosure.

Figure 1:
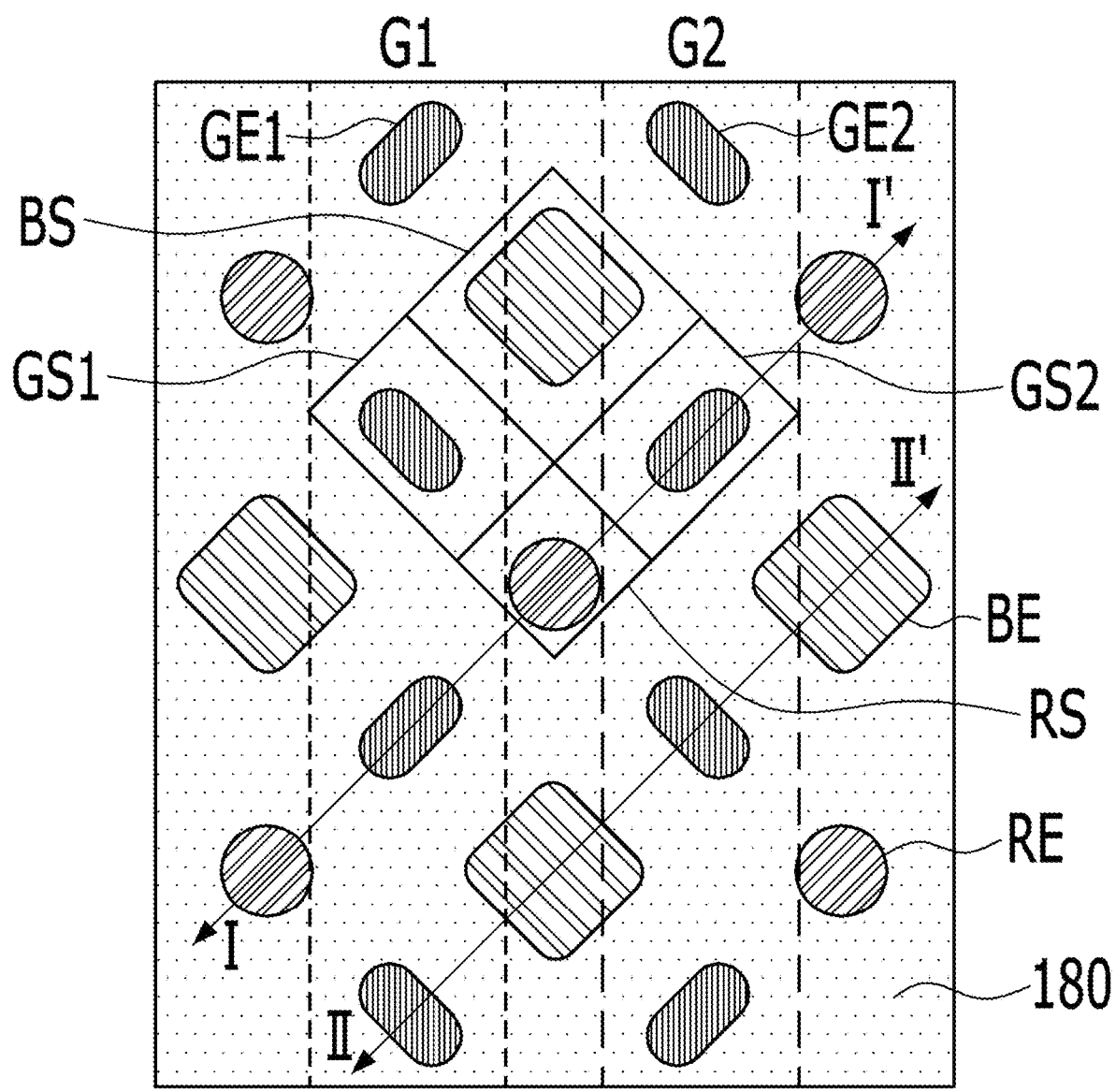
FIG. 1 is a plan view illustrating a light-emitting display device according to a first embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations may be selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments may be provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure may be merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. When terms "include," "have," and "include" described in the present disclosure may be used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case that is not continuous may be included, unless a more limiting term, such as "just," "immediate(ly)," or "direct(ly)," is used.

It will be understood that, although the terms "first," "second," etc. May be used herein to describe various elements, these elements should not be limited by these terms. These terms may be only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms may be merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings may be given merely for the convenience of description, and embodiments of the present disclosure may be not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

In the following description of the embodiments, the term "doped" means that the content of a material having properties different from a material occupying the majority of the weight of a corresponding layer (materials having different properties being, for example, an N-type material and a P-type material or an organic material and an inorganic material), which is added to the material occupying the majority of the weight of the corresponding layer, is less than 30 wt %. In other words, a "doped" layer means a layer in which a host material and a dopant material may be discriminated from each other based on a ratio of the weight percentages thereof. In addition, the term "undoped" means all cases other than the case corresponding to the term "doped". For example, if a layer is formed of a single material or is formed of a mixture of materials having the same or similar properties, the layer may be an "undoped" layer. For example, if at least one of materials forming a layer is P-type and none of the materials forming the layer are N-type, the layer is an "undoped" layer. For example, if at least one of materials forming a layer is organic and none of the materials forming the layer are inorganic, the layer is an "undoped" layer. For example, if all of the materials forming a layer are organic and at least one of the materials forming the layer is N-type and at least another of the other materials is P-type, when the content of the N-type material is less than 30 wt % or the content of the P-type material is less than 30 wt %, the layer is a "doped" layer.

In this disclosure, an electroluminescence (EL) spectrum is calculated by multiplying (1) a photoluminescence (PL) spectrum, which applies the inherent characteristics of an emissive material, such as a dopant material or a host material included in an organic emitting layer, by (2) an outcoupling or emittance spectrum curve, which is determined by the structure and optical characteristics of an organic light-emitting element including the thicknesses of organic layers such as, for example, an electron transport layer.

Hereinafter, example embodiments of the present disclosure will be described in detail with reference to the accompanying drawings.

Figure 2:
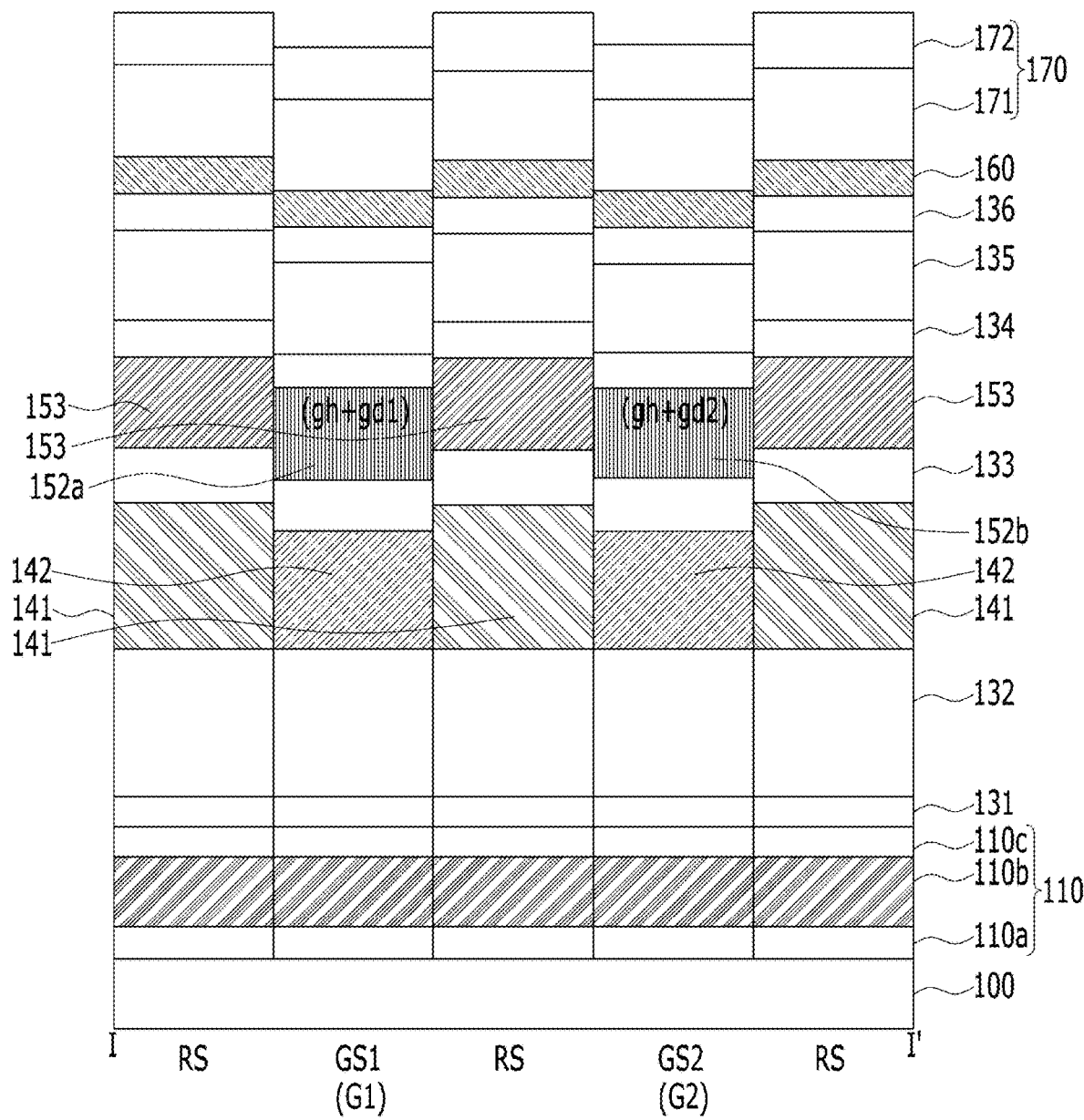
FIG. 2 is a cross-sectional view along line I-I' of FIG. 1.
Figure 3:
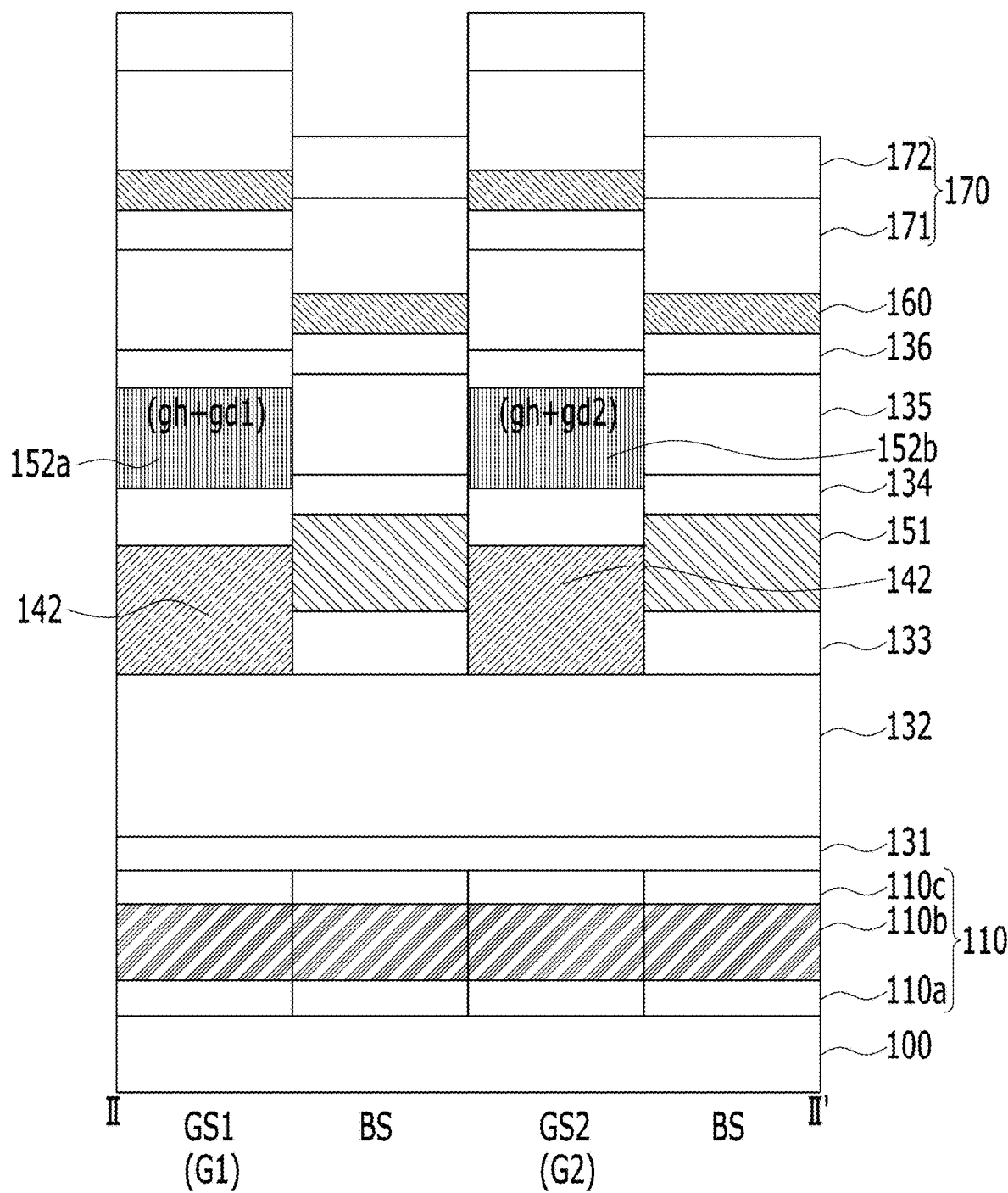
FIG. 3 is a cross-sectional view along line II-II' of FIG. 1.

FIG. 1 is a plan view illustrating a light-emitting display device according to a first embodiment of the present disclosure. FIG. 2 is a cross-sectional view along line I-I' of FIG. 1. FIG. 3 is a cross-sectional view along line II-II' of FIG. 1.

As shown in FIG. 1 to FIG. 3, the light-emitting display device according to a first embodiment of the present may include a first region G1 and a second region G2 spaced apart from each other on a substrate 100. The first region G1 and the second region G2 may be arranged in a regular arrangement in parallel row, columns or diagonal lines. A first group of sub-pixels GS1, each including a first light-emitting layer 152a having a first dopant d1, may be disposed at the first region G1. A second group of sub-pixels GS2, each including a second light-emitting layer 152b having a second dopant d2 different from the first dopant d1, may be disposed at the second region G2.

Each of the first group of sub-pixels GS1 may include a light-emitting element having a first lower electrode 110, e.g., at the first region G1. The first light-emitting layer 152a may have the first dopant d1 on the first lower electrode 110 of the first region, and a common electrode 160 on the first light-emitting layer 152a.

Also, each of the second group of sub-pixels GS2 may include a light-emitting element having a second lower electrode 110, e.g., at the second region G2. The second light-emitting layer 152b may have the second dopant d2 on the second lower electrode 110 of the second region G2, and the common electrode 160 on the second light-emitting layer 152b.

The first and second lower electrodes 110 may be positioned at a same layer in each light-emitting element. Thus, the first and second lower electrodes 110 may function as a lower electrode in each light-emitting element.

The first and second regions G1 and G2 may be horizontally spaced apart from each other. At the first and second regions G1 and G2, sub-pixels emitting a light of same series color may be provided. For example, in FIGS. 1-3, the first and second regions G1 and G2 have green sub-pixels. The first and second regions G1 and G2 may exhibit the same series of emission colors, but the first and second light-emitting layers 152a and 152b in the first and second regions G1 and/or G2 may respectively use first and second dopants gd1 and gd2 having different full widths at half maximum and different electroluminescence EL characteristics.

In the light-emitting display device of the present disclosure, the lower electrode 110 may include a reflective electrode 110b disposed under the light-emitting layers 152a or 152b. The common electrode 160, disposed on the light-emitting layers 152a or 152b, may include a transparent electrode or a transflective electrode in each light-emitting element. By this structure, a light emitted from the light-emitting layers 152a or 152b in each sub-pixel may be repeatedly reflected and re-reflected between surfaces of the lower electrode 110 and the common electrode 160. Then, a light of a strong cavity at a narrow wavelength range may be finally emitted through an upper surface of the common electrode 160.

The first and second lower electrodes 110 at the first and second regions G1 and G2 may be positioned the same, and may have a same structure. For example, each of the first and second lower electrodes 110 may include the reflective electrode 110b, and may include first and second transparent electrodes 110a and 110c under and on the reflective electrode 110b. The second transparent electrode 110b may be provided to improve adhesion at an interface with a hole injection layer 131 of an organic layer, and to improve an energy barrier of injecting holes. The first transparent electrode 110a may be provided to improve adhesion with a thin-film transistor (refer to TFT in FIG. 4).

For example, the reflective electrode 110b may be selected as at least one of: aluminum (Al), an alloy of aluminum, silver (Ag), an alloy of silver, and Ag—Pd—Cu APC, but is not limited thereto. The reflective electrode 110b may have another reflective electrode or another reflective alloy electrode as describe above.

The first lower electrode 110 at the first region G1 and the second lower electrode 110 at the second region G2 may be separate from each other. The common electrode 160 may be commonly provided at the first region G1 and the second region G2 without any separation. Each light-emitting element at the first and second regions G1 and G2 may independently operate due to a separate arrangement in the first and second lower electrodes 110 at the first and second regions G1 and G2. A ground (or low) voltage or a contact voltage may be applied to the common electrode 160. In the light-emitting display device according to the present disclosure, the common electrode 160 may be formed of a transflective electrode or transflective alloy electrode to obtain a strong cavity characteristic by increasing or maximizing a resonance effect due to interfacial reflection with the lower electrode 110. For example, the common electrode 160 may be selected as at least one of silver (Ag), silver alloy, magnesium (Mg), and magnesium alloy. In some cases, the common electrode 160 may be AgMg. Embodiments are not limited thereto.

In the light-emitting display device of the present disclosure, each sub-pixel may exhibit strong cavity characteristics. If each sub-pixel has single strong cavity characteristics, a luminance efficiency may be optimal when viewing the light-emitting display device from a front. However, when viewing the light-emitting display away from the front, e.g., from a side, the optimal optical condition may be deviated, and in this case, a luminance deterioration phenomenon may occur.

In the light-emitting display device of the present disclosure, each light-emitting element at the first and second regions G1 and G2 may have strong cavity characteristics with regard to the front viewing, and light-emitting elements at the first and second regions G1 and G2 may have different electroluminescence to act to complement each other, thereby reducing or preventing a decrease in luminance when viewing the light-emitting display device at a certain viewing angle away from the front.

Figure 9A:
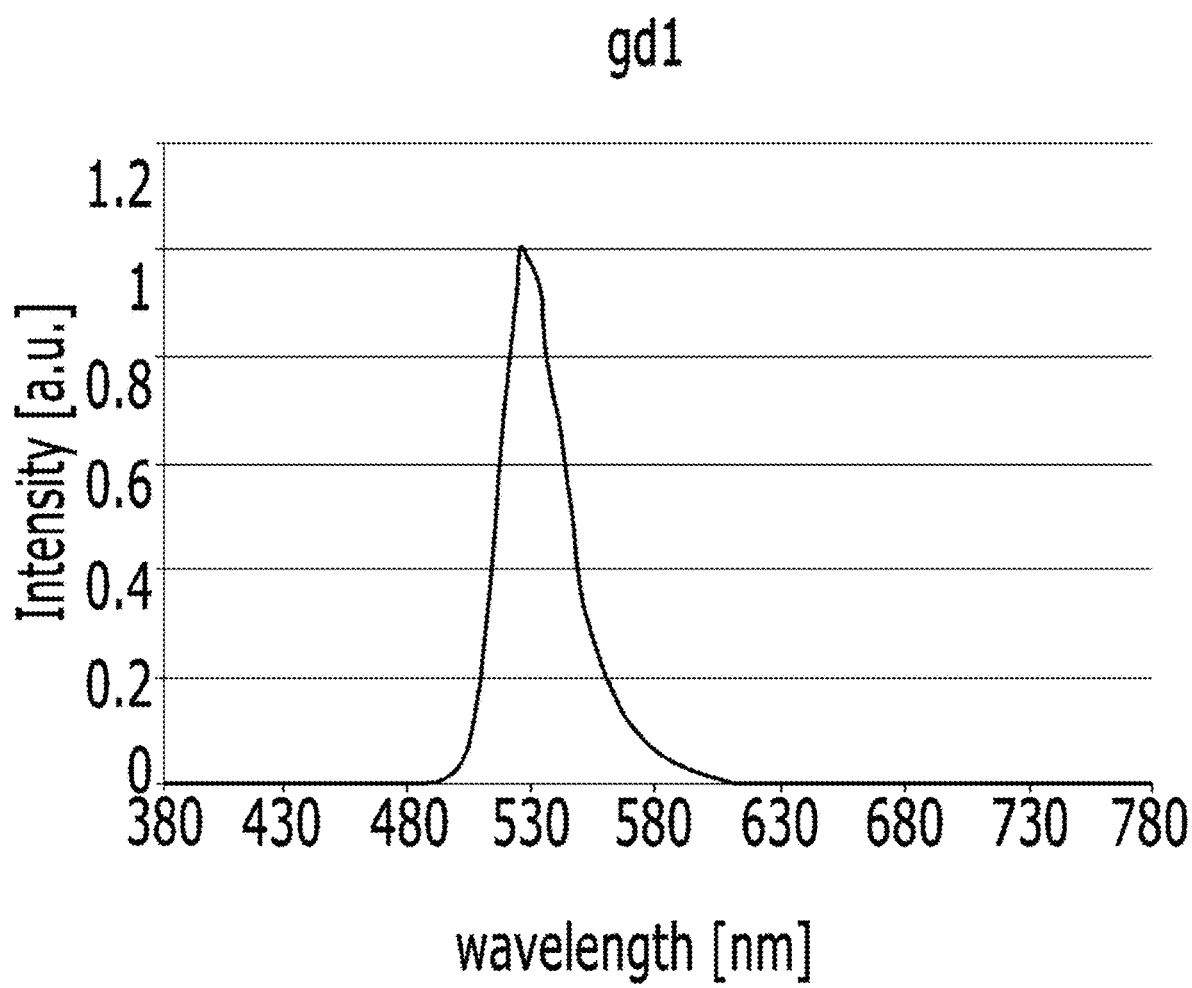
FIG. 9A is a graph illustrating intensity characteristics with respect to a wavelength of the first dopant used in FIG. 8B.
Figure 9B:
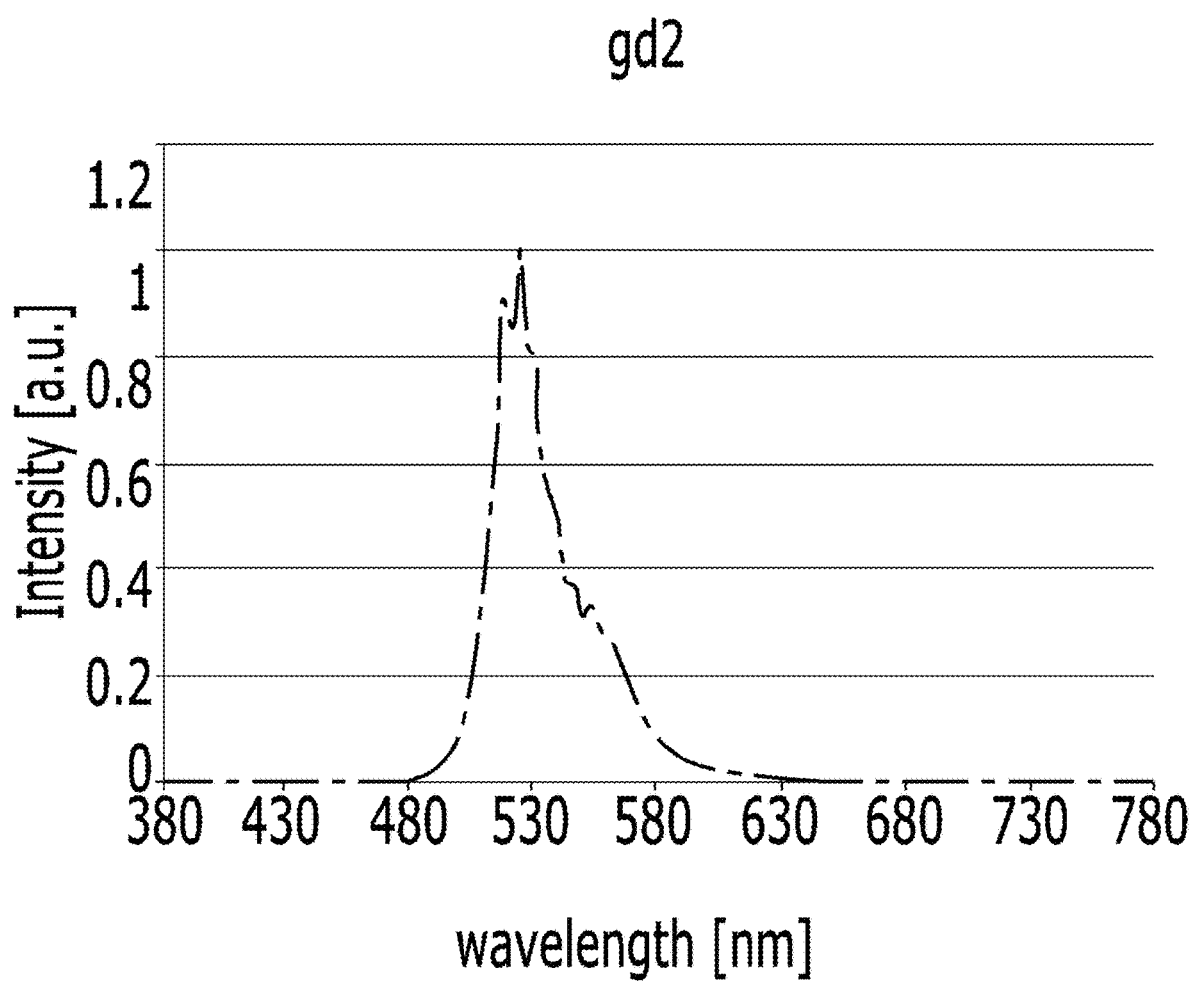
FIG. 9B is a graph illustrating intensity characteristics with respect to a wavelength of the second dopant used in FIG. 8C.
Figure 10:
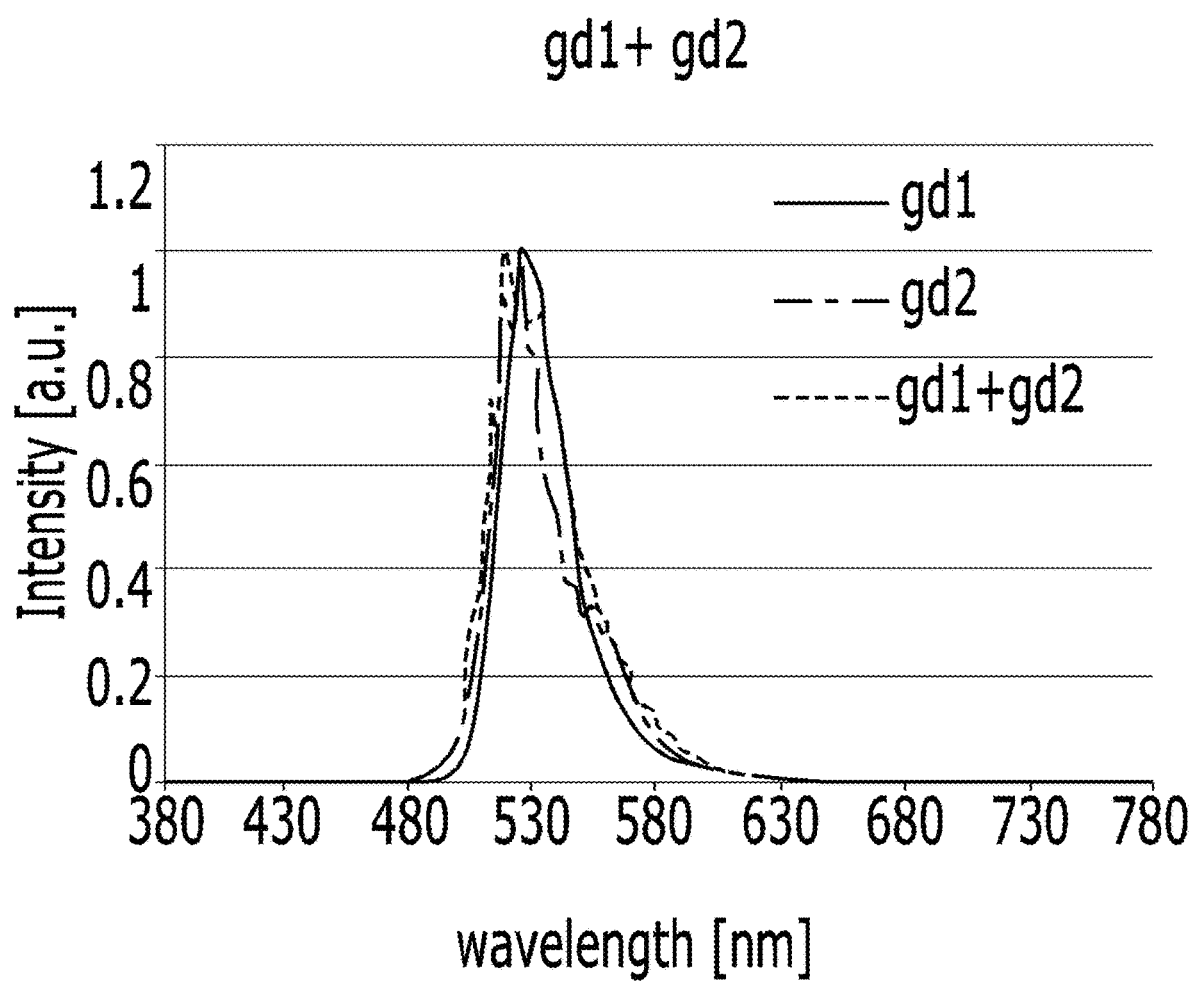
FIG. 10 is a graph illustrating intensity characteristics with respect to a green wavelength of the light-emitting display device according to the present disclosure.

The first and second dopants gd1 and gd2 having different electroluminescence characteristics may be materials emitting green light of the same series, but wavelengths of the electroluminescence peak EL peak of the first and second dopants gd1 and gd2 may not be the same and/or the FWHMs of the first and second dopants gd1 and gd2 may be different. In this case, as shown in FIGS. 9A to 10, a first wavelength region, in which an electroluminescence intensity of the first dopant gd1 may be 50% or more, and a second wavelength region, in which an electroluminescence intensity of the second dopant gd2 may be 50% or more, may have an overlapping region and a non-overlapping region, respectively. That is, the light-emitting display device according to the present disclosure may apply a uniform arrangement of the first and second light-emitting layers 152a and 152b having the first dopant gd1 and the second dopant gd2, respectively, so that electroluminescence effects in the light-emitting display device may be extended. That is, a light-emitting effect may be obtained by superimposing two electroluminescence graphs of the first and second light-emitting layers 152a and 152b having the first and second dopants gd1 and gd2, respectively. Therefore, when viewing the light-emitting display device at a certain angle, tendency to decrease in luminance can be prevented or alleviated.

As shown in FIG. 10, in graphs of intensity according to wavelength with regard to the first and second dopants gd1 and gd2, there may be an overlapping area and a non-overlapping area. As the non-overlapping area increases, an effect of compensating for other luminance by including double dopants gd1 and gd2 may be greater in a viewing angle change. Specific effects will be described later.

In the example of FIG. 1, a first green emission part GE1, a second emission part GE2, a blue emission part BE, and a red emission part RE may be provided in openings of a bank 180. With reference to FIG. 1, a distinction between the first and second green light emission parts GE1 and GE2 may be in which area of the first and second regions G1 and G2 the first and second green light emission parts GE1 and GE2 are located, not in a shape. That is, in the present disclosure, although green emission parts positioned adjacent to each other in the first region G1 and green emission parts positioned adjacent to each other in the second region G2, respectively, have different longitudinal directions, each of green emission parts in the first region G1 may be defined as the "first green emission part GE1" and each of green emission parts of the second region G2 may be defined as the "second green emission part GE2." A second green dopant gd2 may be used in the second green emission part GE2 of the second area G2.

A first green sub-pixel GS1 may include the first green emission part GE1 and a portion of the bank 180 around of the first green emission part GE1. A second green sub-pixel GS2 may include the second green emission part GE2 and a portion of the bank 180 around the second green emission part GE2. Also, a blue sub-pixel BS may include a blue emission part BE and a portion of the bank 180 around the blue emission part BE. Further, a red sub-pixel RS may include the red emission part RE and a portion of the bank 180 around the red emission part RE.

It may be preferable that the first region G1 and the second region G2 be symmetrically arranged to equally compensate for a symmetrical viewing angle change. For example, as shown in FIG. 1, the first region G1 and the second region G2 may be provided in column directions parallel to each other. In some cases, the first region G1 and the second region G2 may be provided in row directions or diagonal directions parallel to each other. Further, the first and second emission parts GE1 and GE2 may respectively have an acute angle with regard to their longitudinal direction of the first and second regions G1 and G2. It may be possible to have a luminance supplement effect, not only in a change of the viewing angle in the horizontal or vertical direction, but also in a change of the viewing angle inclined at various angles. For example, as shown in FIG. 1, the first green emission part GE1 and the second green emission part GE2 may be arranged in the longitudinal direction along two diagonal directions intersecting each other in their columns, and the first and second green emission parts GE1 and GE2 may be alternately provided in a plurality of columns. The present disclosure is not limited thereto. In one region among the first and second regions G1 and G2, one green emission part may be disposed having one diagonal longitudinal direction, and the other green emission part may be disposed having a diagonal longitudinal direction crossing the one diagonal longitudinal direction. In a structure having two different emission parts GE1 and GE2 at two different sections, when the same color emission parts GE1, GE2 have different longitudinal directions, an effect of disposing the same emission parts at various angles may be obtained, without having arrangement dependence in one direction. Therefore, it will be effective in reducing or preventing a luminance deterioration for any viewing angle.

As shown in FIG. 1, the blue sub-pixel BS and the red sub-pixel RS may be alternately arranged with each other between the first and the second regions G1 and G2 in parallel in the first embodiment of the light-emitting display device of the present disclosure. As also shown in FIG. 1, when the first green emission parts GE1 of the first region G1 and the second green emission parts GE2 of second region G2 are arranged along the column direction, respectively, the first green emission part GE1 of the first region G1 and the second green emission part GE2 of second region G2 may be disposed at a same row. Furthermore, the red emission parts RE and the blue emission parts BE may be alternately arranged at a row between adjacent first regions G1 and second regions G2.

In the present disclosure, by using the dopants gd1 and gd2 into adjacent green sub-pixels, respectively, it may be realized to have different electroluminescence characteristics of the same green sub-pixels. In the above embodiment, the green sub-pixels may have different electroluminescence characteristics. However, the present disclosure is not limited thereto. For example, sub-pixels of different colors from the green color, e.g., red sub-pixels and blue sub-pixels, may also be used. That is, it is also possible to reduce or prevent a decrease in luminance due to a change of the viewing angle, by having different electroluminescence characteristics at different columns or different rows in the blue and/or red sub-pixels.

Each of the light-emitting layers 151, 152a, 152b, and 153 may include a host of a main material and a dopant contributing to an emission wavelength of light emission. When forming the first and second light-emitting layers 152a and 152b at different first and second regions G1 and G2, the same host gh may be commonly supplied to the first region G1 and the second region G2, and different dopants gd1 and gd2 are supplied to the first region G1 and the second region G2, respectively. The supply of different dopants gd1 and gd2 may be performed by using different fine metal masks ("FMMs") to the first and second regions G1 and G2, or using a shutter that blocks the other region when dopants are supplied to one region.

As shown in the examples of FIGS. 2 and 3, each of the light-emitting units at the sub-pixels may include an organic stack between two facing electrodes 110 and 160. The minimum configuration of the organic stack may be the light-emitting layer 151, 152a, 152b, or 153. The organic stack may further include common layers 131, 132, 133, 134, 135, and 136 related to transporting holes or electrons as shown in FIGS. 2 and 3.

With reference to FIGS. 2 and 3, the organic stack in the first region G1 corresponding to the first green sub-pixel GS1 will be described hereinafter. A hole injection layer 131, a hole transport layer 132, a first hole transport auxiliary layer 142, an electron blocking layer 133, the first green emitting layer 152a, a hole blocking layer 134, and an electron transport layer 135 may be sequentially disposed on the first lower electrode 110. Also, an electron injection layer 136 may be disposed on the electron transport layer 135, and the common electrode 160 may be provided on the electron injection layer 136.

The electron injection layer 136 may be in direct contact with the common electrode 160, and may include an inorganic material as a dopant or may be only inorganic material. In some cases, the electron injection layer 136 may be provided within the common electrode 160. The electron injection layer 136 may be formed together in a previous stage of the common electrode 160.

The first hole transport auxiliary layer 142 may be selectively provided to adjust an optical distance of a green emission at the first and second green sub-pixels GS1 and GS2. The hole injection layer 131, the hole transport layer 132, the electron blocking layer 133, the hole blocking layer 134, and the electron transport layer 135 are common layers over all sub-pixels GS1, GS2, BS, RS without a separation over sub-pixels. Also, the electron injection layer 136 and the common electrode 160 on the electron transport layer 135 may be common layers over all sub-pixels GS1, GS2, BS, RS without a separation over sub-pixels. The common layers may be formed without a mask having fine openings, such as FMM, because each of the common layers may be a layer integrally formed on the substrate 100.

The first green emitting layer 152a at the first green sub-pixel GS1 may include a green host gh and the first green dopant gd1. The green host gh may include a plurality of different hosts. For example, the green host gh may include at least one of C-545T (10-(2-benzothia-zylyl)-1,1, 7,7-tetramethyl-2, 3, 6, 7-tetrahydro-1H using Alq3 as a parent, 5H,11H-[l]benzo-pyrano[6,7,8-ij]quinolizin-11-ne) and its derivatives, quinacridone derivatives and carbazole derivatives. Embodiments are not limited thereto. When Alq3 is used as a host, green emission may be possible by itself, but other green dopants may be included to improve the efficiency of green emission. As the first green dopant gd1, at least one of a phosphorescent dopant and a fluorescent dopant may be used.

The stacked structure of the organic stack at the second green sub-pixel GS2 may have a same structure as the organic stack at the first green sub-pixel GS1, except that the second green emitting layer 152b having the second green dopant gd2 may be proved for electroluminescence characteristics different from the first green light-emitting layers 152a. Thus, other common layers of the hole injection layer 131, the hole transport layer 132, the electron blocking layer 133, the hole blocking layer 134, the electron transport layer 135, the electron injection layer 136, and the common electrode 160 may be provided at the second green sub-pixel GS2. The second green emitting layer 152b may be positioned between the electron blocking layer 133 and the hole blocking layer 135. For example, the first and second green dopants gd1 and gd2 may have different electroluminescence peaks at different wavelengths and different full widths at half maximums FWHMs. Thus, the first and second green emitting layers 152a and 152b, including the first and second green dopants gd1 and gd2, may complement each other to have an effect of improving a half-width, thereby improving a luminance.

The organic stack of the red sub-pixel RS may include a second hole transport auxiliary layer 141 and a red emitting layer 153 instead of the first hole transport auxiliary layer 142 and the first and second green emitting layer 152a and 152b, and may include the other common layers of 131, 132, 133, 134, 135, 136, and 160. A light-emitting unit at the red sub-pixel RS may include a third lower electrode 110 at RS, the hole injection layer 131, the hole transport layer 132, the second hole transport auxiliary layer 141, the electron blocking layer 133, the red emitting layer 153, the hole blocking layer 134, the electron transport layer 135, the electron injection layer 136, and the common electrode 160 sequentially stacked.

Host material used for the red emitting layer 153 may have an aryl group as a core. The host material for red emitting layer 153 may be selected from at least one of: a substituted or unsubstituted aryl group having 6 to 24 carbon atoms, a substituted or unsubstituted heteroaryl group, a substituted or unsubstituted C10 to 30 carbon atoms of a fused aryl group, a substituted or unsubstituted heteroaryl group having 2 to 24 carbon atoms, a substituted or unsubstituted alkyl group having 1 to 24 carbon atoms, a substituted or unsubstituted heteroalkyl group having 1 to 24 carbon atoms, a substituted or unsubstituted cycloalkyl group having 3 to 24 carbon atoms, substituted or unsubstituted C1-C24 alkoxy group, substituted or unsubstituted C6-C24 aryloxy group, substituted or unsubstituted C1-C24 alkylsilyl group, substituted or unsubstituted arylsilyl group, and/or at least one from substituted or unsubstituted arylsilyl group having 6 to 24 carbon atoms, a cyano group, a halogen group, deuterium, and hydrogen. C11 to C24 may form a fused ring with a neighboring substituent. Embodiments are not limited thereto.

Also, the host of the red emitting layer 153 may be at least one of: phenyl, naphthalene, fluorene, carbazole, phenazine, phenanthroline, phenanthridine, acridine, cinoline, quinazoline, quinoxaline, naphtithrin, phthalazine, quinolazane, indole, indazole, pyridazine, pyrazine, pyrimidine, pyridine, pyrazole, imidazole, and pyrrole. For example, the host material of the red emitting layer 153 may include at least one of CBP, CDBP, mCP, BCP, BAlq, TAZ, and the like, and one or more of these materials may be included. Embodiments are not limited thereto.

The red emitting layer 153 may include a red dopant to emit a red color light. As a phosphorescent dopant, the red emitting layer 153 may include a dopant that may be selected from $Ir(piz)_3$(Tris(1-phenylisoquinoline)iridium (III), $Ir(piq)_2$(acac)(Bis(1-phenylisoquinoline(acetylacetonate) iridium(III), $Ir(bip)_2$(acac)(Bis)2-benzolbithiophen-2-yl-pyridime)(acetylacetonate)iridium(III)), $Ir(BT)_2$(acac)(Bis(2-pheylbenzothazolato)(acetylacetonate)iridium(III), etc., but is not limited thereto. As a fluorescent dopant, the red emitting layer 153 may include a dopant, such as Rubrene(5, 6, 11, 12-tetraphenylnaphthacene), DCJTB(4-(dicyanlmethylene)-2-tert-butyl-6-(1,1,7,7-tetramethyljuloidin-4-yl-viyl)-4H). Embodiments are not limited thereto.

The blue sub-pixel BS may not include a hole transport auxiliary layer that is different from the first and second green sub-pixels GS1 and GS2 and the red sub-pixel RS. The first and second hole transport auxiliary layers 142 and 141 may be provided for adjusting optical distances for different emission colors. Because the blue sub-pixel BS, in which an emission region may be generated, is a short distance from the fourth lower electrode 110 at BS, the blue sub-pixel BS may not require an additional hole transport auxiliary layer. In contrast, as shown in FIGS. 2 and 3, the first and second green sub-pixels GS1 and GS2 and the red sub-pixel RS, which have longer optical distance from their lower electrode 110 compared to the blue sub-pixel BS, may have the first and second hole transport auxiliary layers 142 and 141. In addition, there may be a difference in thickness between the hole transport auxiliary layers 142 and 141. In addition, the optical distance of each light-emitting layer may be adjusted through a difference in thickness of each of the light-emitting layers 152a, 152b, 151, and 153. In some cases, different hole transport auxiliary layers 142 and 141 for each sub-pixel and different thickness of the light-emitting layers 152a, 152b, 151, and 153 may be applied together.

A light-emitting unit at the blue sub-pixel BS may include a third lower electrode 110 at BS, the hole injection layer 131, the hole transport layer 132, the electron blocking layer 133, the blue emitting layer 151, the hole blocking layer 134, the electron transport layer 135, the electron injection layer 136, and the common electrode 160 sequentially stacked.

The blue emitting layer 151 may include at least one blue host and at least one blue dopant. For example, at least one fluorescent host material among: an anthracene derivative, a pyrene derivative, and a perylene derivative may be doped with a pyrene-based or boron-based fluorescent blue dopant, but embodiments are not limited thereto. If there is a development of a stable phosphorescent blue material with a blue dopant, an alternative would be possible.

In the light-emitting display device of the present disclosure, the blue emitting layer 151 may emit light at a wavelength of 420 nm to 500 nm, the first and second green emitting layers 152a and 152b may emit light at 500 nm to 590 nm, and the red emitting layer 153 may emit light at a wavelength of 590 nm to 660 nm. The blue emitting layer 151, the first and second green emitting layers 152a and 152b, and the red emitting layer may have their emission peaks in the above-described wavelength region, respectively.

Electroluminescence peaks of the first green emitting layer 152a and the second green emitting layer 152b may be at a wavelength range of 510 nm to 580 nm. An electroluminescence peak of the blue emitting layer 151 may be at a wavelength range of 440 nm to 480 nm, and an electroluminescence peak of the red emitting layer 153 may be at a wavelength range of 605 nm to 645 nm.

At each sub-pixel, a capping layer 170 may be formed on the common electrode 160. The capping layer 170 may be provided to improve an extraction effect of light emitted from the light-emitting device of the each sub-pixel, and to protect the light-emitting device.

As shown in FIGS. 2 and 3, the capping layer 170 may include an organic capping layer 171 and an inorganic capping layer 172. In some cases, the capping layer 170 may include a single one of an organic capping layer or an inorganic capping layer, or an organic-inorganic hybrid capping layer.

Figure 4:
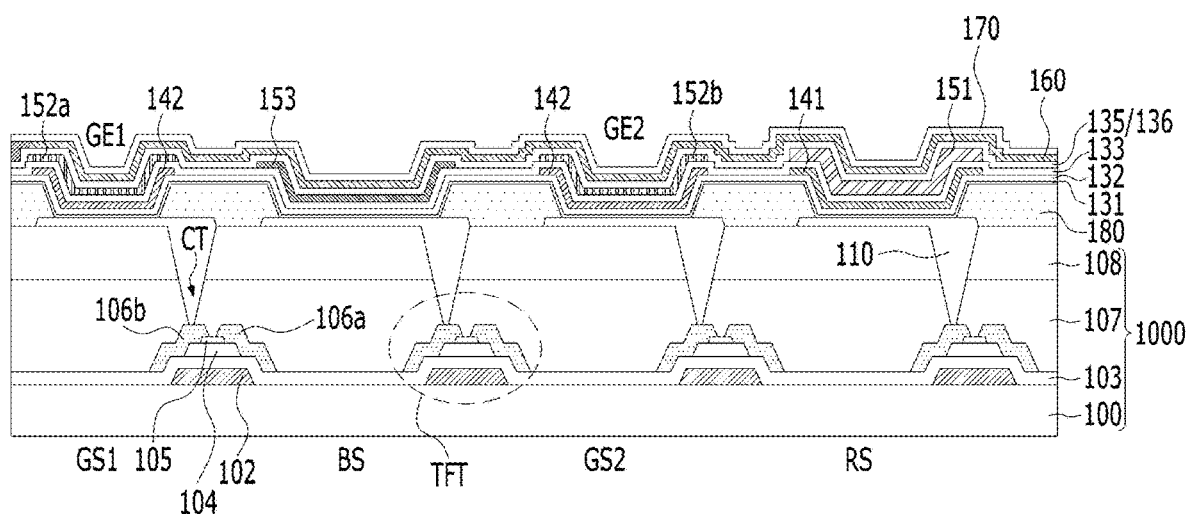
FIG. 4 is a detailed cross-sectional view illustrating a light-emitting display device according to an embodiment of the present disclosure.

FIG. 4 is a detailed cross-sectional view illustrating a light-emitting display device according to an embodiment of the present disclosure.

A configuration of each thin-film transistor TFT connected to the first lower electrode to the fourth lower electrode 110, which may be the lower electrode of each of the sub-pixels GS1, GS2, RS, and BS, will be described with reference to FIG. 4. In the illustrated example, a thin-film transistor array substrate 1000 may be referred to as a configuration having a substrate 100 and a thin-film transistor array on the substrate 100.

Each sub-pixel GS1, BS, GS2, RS may include at least one thin-film transistor TFT. The thin-film transistor TFT may include a gate electrode 102, an active layer 104 overlapping the gate electrode 102, a drain electrode 106a, and a source electrode 106b contacting both sides of the active layer 104.

A channel protective layer 105 may be provided on a channel of the active layer 104. A gate insulating film 103 may be further provided between the gate electrode 102 and the active layer 104. The active layer 104 may be formed of, for example, amorphous silicon, polycrystalline silicon, an oxide semiconductor, or a combination of two or more thereof. Embodiments are not limited thereto.

Also, the thin-film transistor array substrate 1000 may include a first protective layer 107 and a second protective layer 108 to protect the thin-film transistor TFT. One of the first protective layer 107 and the second protective layer 108 may be an organic layer, and the other may be an inorganic layer among the first and second protective layers 107 and 108.

Further, the source electrode 106b of the thin-film transistor TFT may be connected to the lower electrode 110 by a contact hole CT formed within first and second protective films 107 and 108. Each emission part of each sub-pixel may be defined as an opening of the bank 180.

Figure 5A:
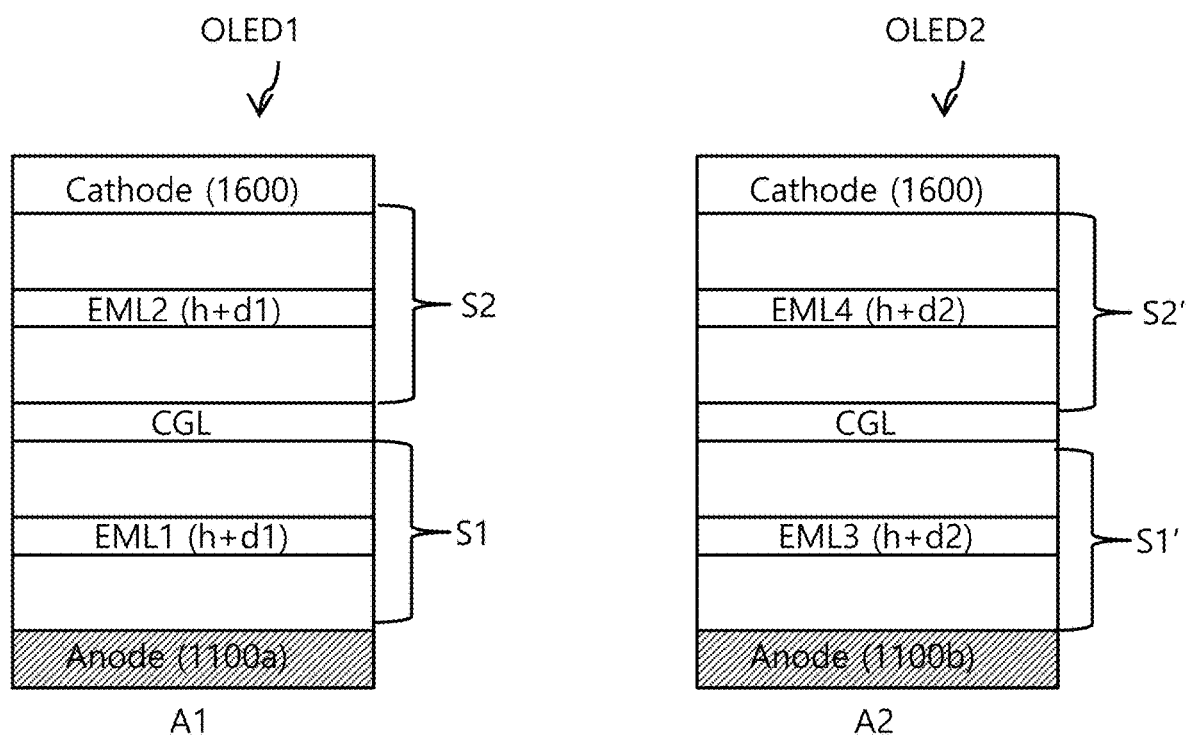
FIG. 5A and FIG. 5B are cross-sectional views illustrating light-emitting display devices according to second and third embodiments of the present disclosure.
Figure 5B:
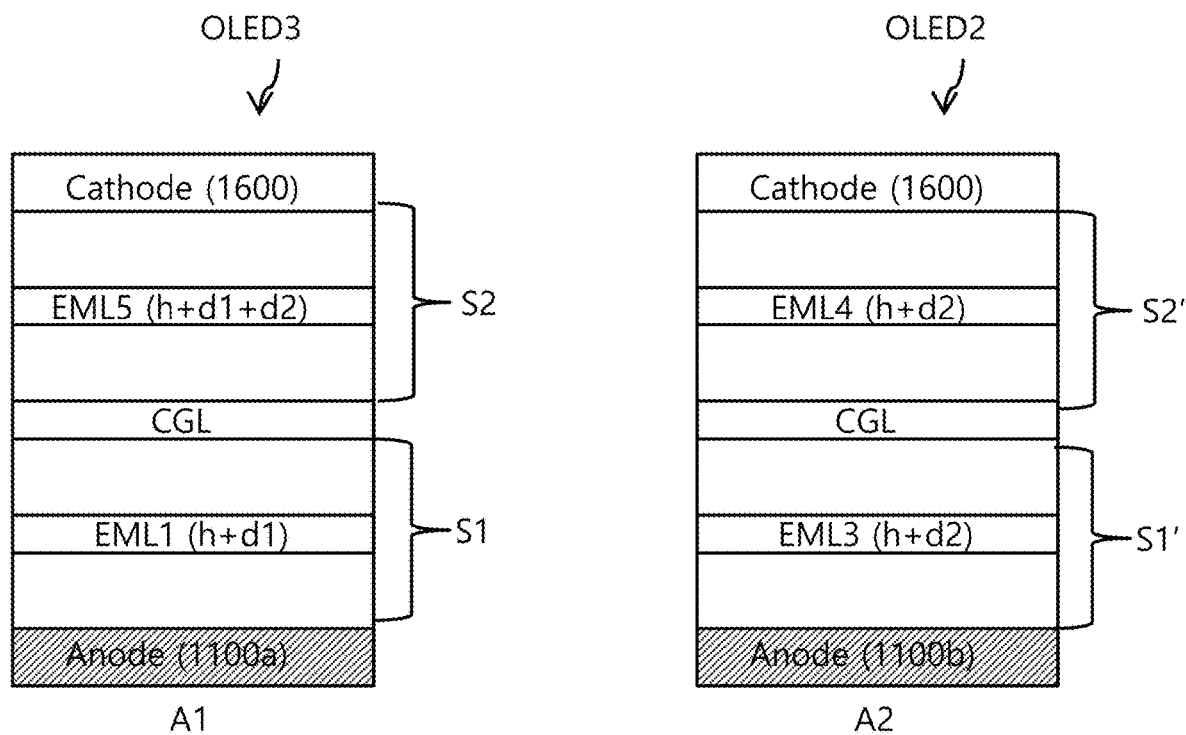

FIG. 5A and FIG. 5B are cross-sectional views illustrating light-emitting display devices according to second and third embodiments of the present disclosure.

As shown in the example of FIG. 5A, the light-emitting display device according to second embodiment of the present disclosure may include a light-emitting device having a plurality of stacks at each region. A first light-emitting device OLED1 at a first region A1, and a second light-emitting device OLED2 at a second region A2 having different electroluminescence characteristics, are provided. At the first and second regions A1 and A2, the plurality of stacks S1 and S2, which may be divided by a charge generation layer CGL, may be commonly provided between the lower electrodes 1100a and 1100b, and the common electrode 1600.

At the first region A1, the first stack S1 may include a first light-emitting layer EML1 having a host h and a first dopant d1, and the second stack S2 may include a second light-emitting layer EML2 having the host h and the first dopant d1 that is the same as the first light-emitting layer EML1. There may be common layers, as described above, between the lower electrode 1100a and the first light-emitting layer EML1, between the first light-emitting layer EML1 and the charge generation layer CGL, between the charge generation layer CGL and the second light-emitting layer EML2, and between the second light-emitting layer EML2 and the common electrode 1600.

At the second region A2, the first stack S1' may include a third light-emitting layer EML3 having a host h and the second dopant d2, and the second stack S2' may include a fourth light-emitting layer EML4 having the host h and the second dopant d2 that is the same as the third light-emitting layer EML3. There may be common layers, as described above, between the lower electrode 1100a and the third light-emitting layer EML3, between the third light-emitting layer EML3 and the charge generation layer CGL, between the charge generation layer CGL and the fourth light-emitting layer EML4, and between the fourth light-emitting layer EML4 and the common electrode 1600.

The configuration of the first and second light-emitting devices OLED1 and OLED2 described above may be provided for sub-pixels of the same color series provided on the substrate. The first and second light-emitting devices OLED1 and OLED2 may be provide at green sub-pixels, or any one or more of the red sub-pixels and blue sub-pixels.

By an equally divided arrangement of the first and second light-emitting elements OLED1 and OLED2, the effect of electroluminescence of each of the first and second light-emitting elements OLED1 and OLED2 may be expanded and exhibited. That is, the electroluminescence effect of the first and second light-emitting layers EML1 and EML2, and the electroluminescence effect of the third and fourth light-emitting layers EML3 and EML4 are superimposed. Also, the light-emitting display device one have narrow electroluminescence characteristics with regard to each light-emitting device OLED1 and OLED2 at a front of the light-emitting display device, and one also prevent or alleviate a tendency to decrease luminance by expanded electroluminescence characteristics when the light-emitting display device is viewed from an angle to the front of the light-emitting display device.

As shown in the example of FIG. 5B, a light-emitting display device according to the third embodiment of the present disclosure may include the same configuration as the second light-emitting device OLED2 of the second embodiment at a second region A2 and a third light-emitting device OLED3 at a first region A1. The third light-emitting device OLED 3 may include different light-emitting layers EML1 and EML5 in different stacks S1 and S2 at the first area A1. That is, the first light-emitting layer EML1 of the first stack S1 may include a host h and a first dopant d1, and the second light-emitting layer EML5 of the second stack S2 may include the host h and two dopants d1 and d2 together. In this case, the luminance compensation according to the change in the viewing angle can be performed more effectively than in the second embodiment. The second light-emitting layer EML5 using dopants in combination may be provided in the first stack S1 instead of the second stack S2.

Figure 6:
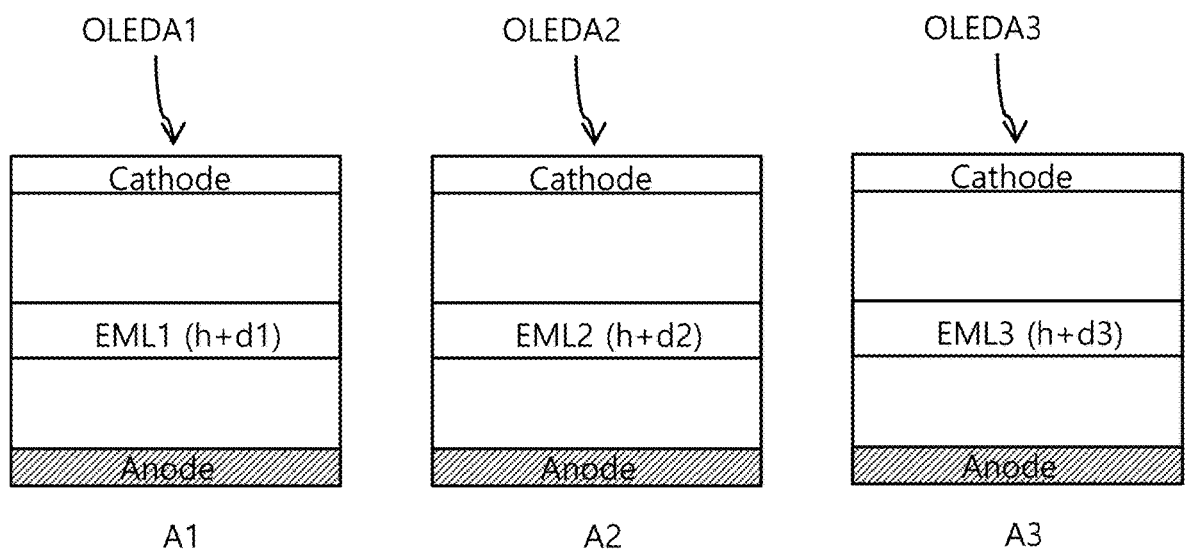
FIG. 6 is a cross-sectional view illustrating a light-emitting display device according to a fourth embodiment of the present disclosure.

FIG. 6 is a cross-sectional view illustrating a light-emitting display device according to fourth embodiment of the present disclosure.

As shown in the example of FIG. 6, in a light-emitting display device according to the fourth embodiment of the present disclosure, sub-pixels of the same series may be divided into three or more regions A1, A2, and A3. The light-emitting devices OLEDA1, OLEDA2, and OLEDA3 may use different dopants d1, d2, and d3 in the light-emitting layers EML1, EML2, and EML3. In the light-emitting layers EML1, EML2, and EML3, a common host h may be provided. In this case, it may be possible to more effectively reduce or prevent a decrease in luminance due to a change in the viewing angle.

Figure 7:
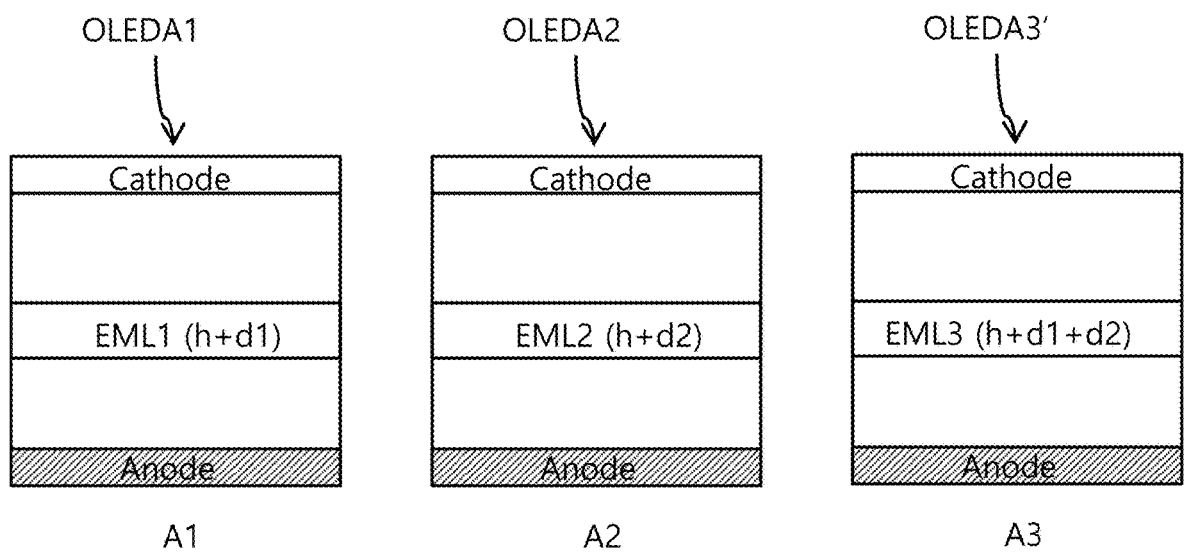
FIG. 7 is a cross-sectional view illustrating a light-emitting display device according to a fifth embodiment of the present disclosure.

FIG. 7 is a cross-sectional view illustrating a light-emitting display device according to fifth embodiment of the present disclosure.

As shown in FIG. 7, in a light-emitting display device according to the fifth embodiment of the present disclosure, sub-pixels of the same series may be divided into three or more regions A1, A2, and A3. The light-emitting devices OLEDA1, OLEDA2, and OLEDA3' may use different dopants d1, d2, and d1+d2 in the light-emitting layers EML1, EML2, and EML3 for different electroluminescence characteristics. In the light-emitting layers EML1, EML2, and EML3, a common host h may be provided.

In this case of the fifth embodiment, compared to the first embodiment, the regions A1, A2, and A3 of the same series may be more finely provided, but usage of the dopants can be made the same as the first embodiment, so that the effect of preventing a decrease in luminance due to a change in the viewing angle can be excellent. In this case, the first dopant d1 used in the third light-emitting layer EML3 of the third light-emitting device OLEDA3' may be deposited together at the third region A3 when forming the first light-emitting layer EML1 of the first light-emitting device OLED1; and the second dopant d2 in the third light-emitting layer EML3 may be deposited together at the third region A3 when forming the second light-emitting layer EML2 of the second light-emitting device OLED2.

Hereinafter, a method of manufacturing a light-emitting display device of the present disclosure will be described.

Figure 8A:
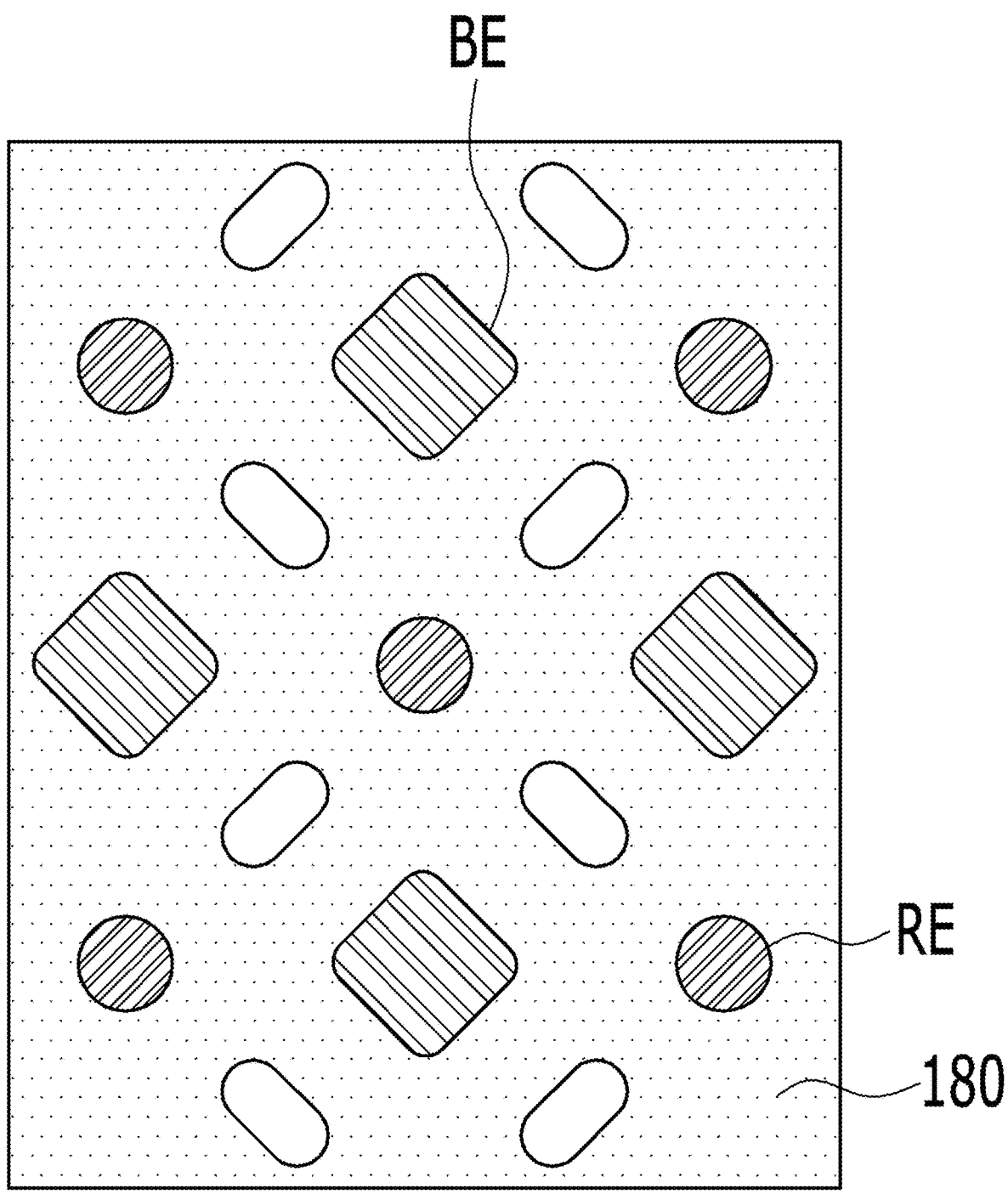
FIG. 8A to FIG. 8C are process plan views illustrating a method of manufacturing a light-emitting display device according to an embodiment of the present invention.
Figure 8B:
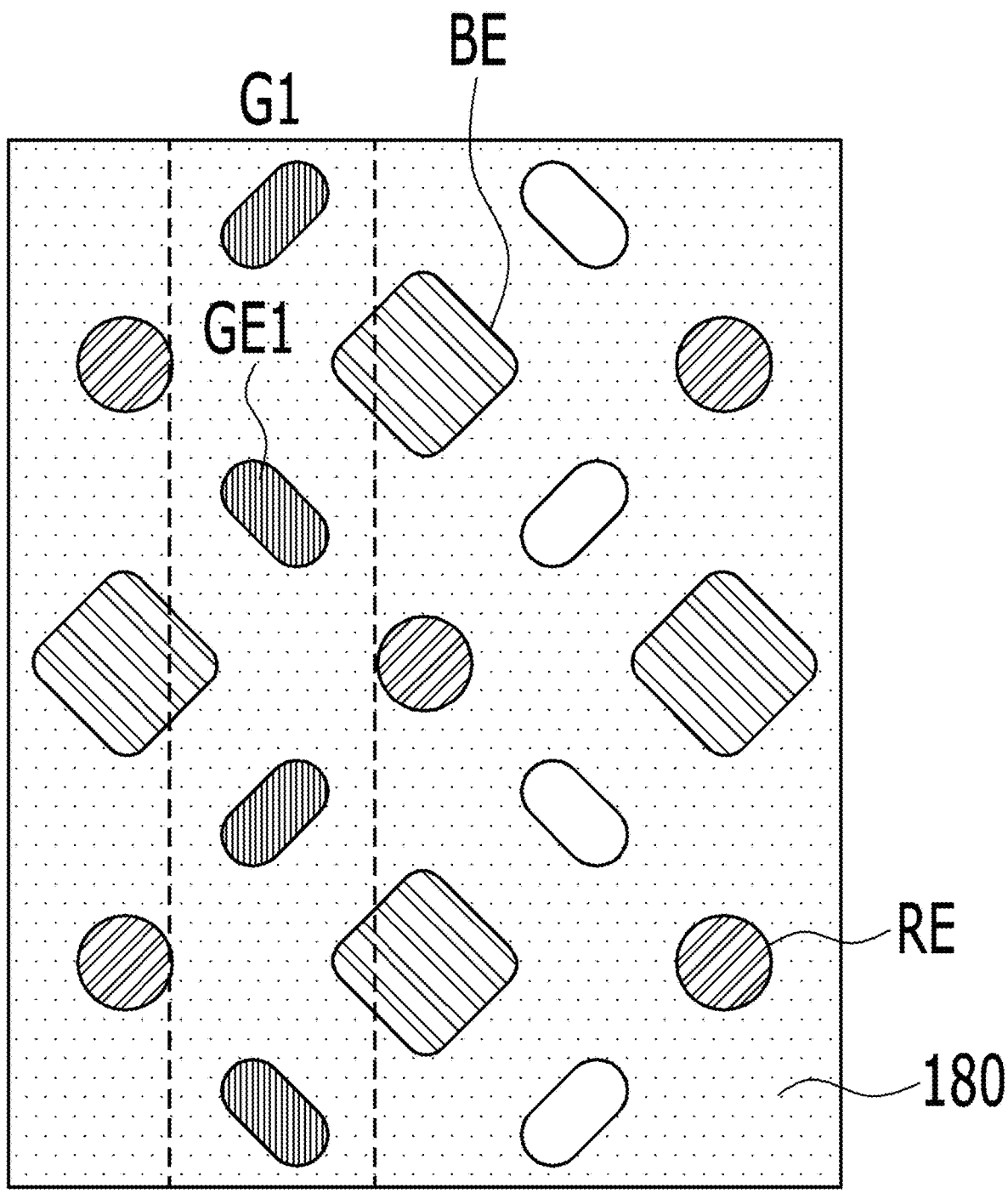
Figure 8C:
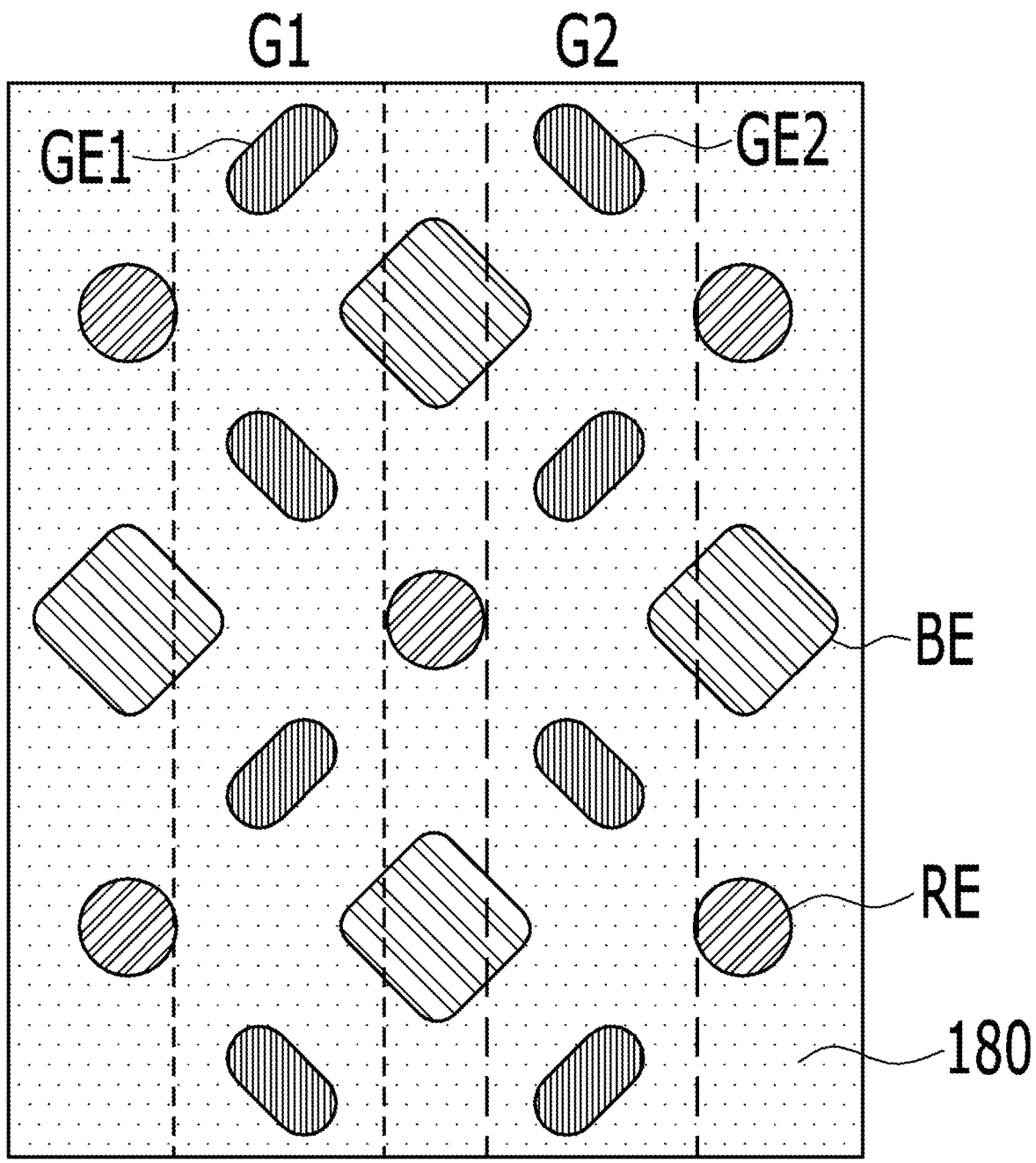

FIG. 8A to FIG. 8C are process plan views illustrating a method of manufacturing a light-emitting display device according to an embodiment of the present invention. FIG. 9A is a graph illustrating intensity characteristics with respect to a wavelength of the first dopant used in FIG. 8B. FIG. 9B is a graph illustrating intensity characteristics with respect to a wavelength of the second dopant used in FIG. 8C.

The following also refers to the configuration according to the examples of FIGS. 2 to 4. Firstly, as shown in FIGS. 2 and 3, a lower electrode 110 including a reflective electrode may be formed on a substrate 100 that may have a thin-film transistor (refer to TFT of FIG. 4) at each sub-pixel. Next, a bank 180 partially overlapping boundaries of the lower electrode 110 may be formed. The openings of the bank 180 may later be defined as light emission parts.

As shown in the example of FIG. 8A, a red light-emitting layer (refer to 153 in FIG. 2) and a blue light-emitting layer (refer to 151 in FIG. 3) are respectively formed corresponding to the red light emission part RE and the blue light emission part BE. The red emitting layer may include a red host and a red dopant, and the blue emitting layer may include a blue host and a blue dopant.

As shown in the example of FIG. 8B, a first green dopant gd1 may be deposited together with a green host gh to emit the first green color at the light emission parts GE1 in the first region G1. Thus, a first green light-emitting layer 152a corresponding to the light emission part GE1 may be formed.

As shown in the example of FIG. 8C, a second green dopant gd2 may be deposited together with the green host gh to emit the second green color at the light emission parts GE2 in the second region G2. Thus, a second green light-emitting layer 152b corresponding to the light emission part GE2 may be formed.

For example, as shown in Table 1 and FIG. 9A, the first green dopant gd1 used to form the first green emitting layer 152a may have an EL peak wavelength of 528 nm and a full width at half maximum ("FWHM") of 28.0 nm. Also, as shown in Table 1 and FIG. 9B, the second green dopant gd2 used to form the second green emitting layer 152b may have an EL peak wavelength of 524 nm, and a FWHM may be 29.9 nm.

TABLE 1

| Division | EL peak wavelength (nm) | FWHM (nm) |
|---|---|---|
| The first green dopant (gd1) | 528 | 28.0 |
| The second green dopant (gd2) | 524 | 29.9 |
| Effect of superimposing | 526 | 33.0 |

FIG. 10 is a graph illustrating intensity characteristics with respect to a green wavelength of the light-emitting display device according to the present disclosure.

Each of the first and second green dopants gd1 and gd2 may have an FWHM of 30.0 nm or less. However, as shown in FIG. 10, the graphs of the EL characteristics of the first and second green dopants gd1 and gd2 are different from each other. The graph of the first green dopant gd1 has a non-overlapping region on a right side and the graph of the second green dopant gd2 has a non-overlapping region on a left side with the overlapping region of the graphs of the first and second green dopants gd1 and gd2, so that at least FWHM of the light-emitting display device having the first and second green light-emitting layers having the first and second green dopants may be extended to the non-overlapping region between the two graphs in addition to the overlapping region between the two graphs. Accordingly, as shown in Table 1 and the examples of FIGS. 1 to 4, in the light-emitting display device of the present disclosure having the first green light-emitting layer 152a and the second green light-emitting layer 152b in different regions G1 and G2, the FWHM has an improved effect to 33.0 nm. That is, it has an improved effect of 4.0 nm compared to the FWHM of the first green light-emitting layer 152a. Thus, the improved FWHM leads to an effect of improving luminance.

That is, a first wavelength region, in which an electroluminescence intensity of the first dopant may be 50% or more, and a second wavelength region, in which an electroluminescence intensity of the second dopant may be 50% or more, may have the overlapping region and the non-overlapping region, respectively. Also, the wavelength region, including the overlapping region and the non-overlapping region of the first and second wavelength regions, may be provided within 30 nm or more.

Table 1 is according to an example. If a first dopant and a second dopant of different light-emitting layers in different regions to emit the same color series have a wavelength difference of 1 nm to 40 nm or less of the electroluminescence peak, a decrease in luminance will be reduced or prevented according to change of viewing angles, by different electroluminescence characteristics at different regions.

Hereinafter, an effect of realizing a front white emission represented by an application of different FWHMs of each light-emitting layer in the light-emitting display device will be described.

Table 2 shows variations in luminance characteristics of green and ratios of white luminance of each experimental example compared to the first experimental example (Ex1) by fixing the color coordinates of green to (0.238, 0.724) and by varying FWHMs of the green light-emitting layers, respectively.

When each light-emitting device having the green light-emitting layer, according to the first to fifth experimental examples Ex1 to Ex5, is viewed at a front of the light-emitting display device, as the FWHM of the green light-emitting layer increases, a luminance of green decreases. However, white luminances according to the second to fifth experimental examples Ex2 to Ex5 are similar to a white luminance according to the first experimental example Ex1. For the first and fifth experimental examples Ex1 and Ex5 having the biggest difference in their FWHMs, the white luminance of the fifth experimental example Ex5 has only 0.7% decrease from the first experimental example Ex1. It means there is little perceptible difference between the first experimental example Ex1 and the fifth experimental example Ex5.

TABLE 2

| | | | Green | | |
|---|---|---|---|---|---|
| Division | CIEx | CIEy | FWHM (nm) | Luminance (Cd/A) | Ratio of White Luminance compared to Ex1 (%) |
| Ex1 | 0.238 | 0.724 | 16.7 | 144.3 | 100.0 |
| Ex2 | | | 18.9 | 143.5 | 99.9 |
| Ex3 | | | 21.3 | 142.4 | 99.7 |
| Ex4 | | | 24.8 | 141.0 | 99.4 |
| Ex5 | | | 25.4 | 140.4 | 99.3 |

Table 3 shows variations in luminance characteristics of red and ratios of white luminance of each experimental example compared to the sixth experimental example Ex6 by fixing the color coordinates of red to (0.683, 0.317) and by varying FWHMs of the red light-emitting layers, respectively. When each light-emitting device having the red light-emitting layer, according to the sixth to tenth experimental examples Ex6 to Ex10, is viewed at a front of the light-emitting display device, as the FWHM of the red light-emitting layer increases, a luminance of red itself decreases. However, white luminances according to the seventh to tenth experimental examples Ex7 to Ex10 are similar to a white luminance according to the sixth experimental example Ex6. For the sixth and tenth experimental examples Ex6 and Ex10 having the biggest difference in their FWHMs, the white luminance of the tenth experimental example Ex10 has only 1.2% decrease from the sixth experimental example Ex6. It means there is little perceptible difference between the sixth experimental example Ex6 and the tenth experimental example Ex10.

TABLE 3

| Division | CIEx | CIEy | Red FWHM (nm) | Luminance (Cd/A) | Ratio of White Luminance compared to Ex6 (%) |
|---|---|---|---|---|---|
| Ex6 | 0.683 | 0.317 | 16.3 | 42.2 | 100.0 |
| Ex7 | | | 18.8 | 41.4 | 99.4 |
| Ex8 | | | 22.4 | 41.2 | 99.2 |
| Ex9 | | | 25.5 | 41.1 | 99.2 |
| Ex10 | | | 31.6 | 40.7 | 98.8 |

Table 4 shows variations in luminance characteristics of red and ratios of white luminance of each experimental example compared to the eleventh experimental example Ex11 by fixing the color coordinates of blue to (0.135, 0.052) and by varying FWHMs of the blue light-emitting layers, respectively. When each light-emitting device having the blue light-emitting layer, according to the eleventh to fifteenth experimental examples Ex11 to Ex15, is viewed at a front of the light-emitting display device, as the FWHM of the blue light-emitting layer increases, a luminance of blue itself decreases. However, white luminances according to the twelfth to fifteenth experimental examples Ex12 to Ex15 are similar to a white luminance according to the sixth experimental example Ex11. For the eleventh and fifteenth experimental examples Ex11 and Ex15 having the biggest difference in their FWHMs, the white luminance of the fifteenth experimental example Ex15 has only 2.4% decrease from the eleventh experimental example Ex11. It means there is little perceptible difference between the eleventh experimental example Ex11 and the fifteenth experimental example Ex10.

TABLE 4

| Division | CIEx | CIEy | Blue FWHM (nm) | Luminance (Cd/A) | Ratio of White Luminance compared to Ex11 (%) |
|---|---|---|---|---|---|
| Ex11 | 0.135 | 0.052 | 14.5 | 8.0 | 100.0 |
| Ex12 | | | 15.8 | 7.9 | 99.4 |
| Ex13 | | | 16.8 | 7.8 | 98.9 |
| Ex14 | | | 18.5 | 7.7 | 98.6 |
| Ex15 | | | 22.0 | 7.6 | 97.6 |

Comparing the results of Tables 2 to 4 described above, in realizing white, the luminance of green has the highest contribution. Also, when FWHMs of the green light-emitting layer are changed, the luminances of white are almost equal. Thus, changing the FWHMs of the green light-emitting layer does not affect realization of a white emission, rather than when FWHMs of the other color light-emitting layer are changed. That is, in the light-emitting display device of the present disclosure, it may be more effective, to improve the luminance degradation due to the change in the viewing angle, without the influence of the front white luminance, that the green sub-pixels, which make the highest contribution to white luminance, be divided into two or multiple divisions having different FWHMs. If the sub-pixels having the highest contribution of white luminance according to a structural change are sub-pixels of a color other than the green sub-pixels, the division structure of the light-emitting layer for multiple regions as in the present disclosure may be applied to sub-pixels of different colors.

Figure 11A:
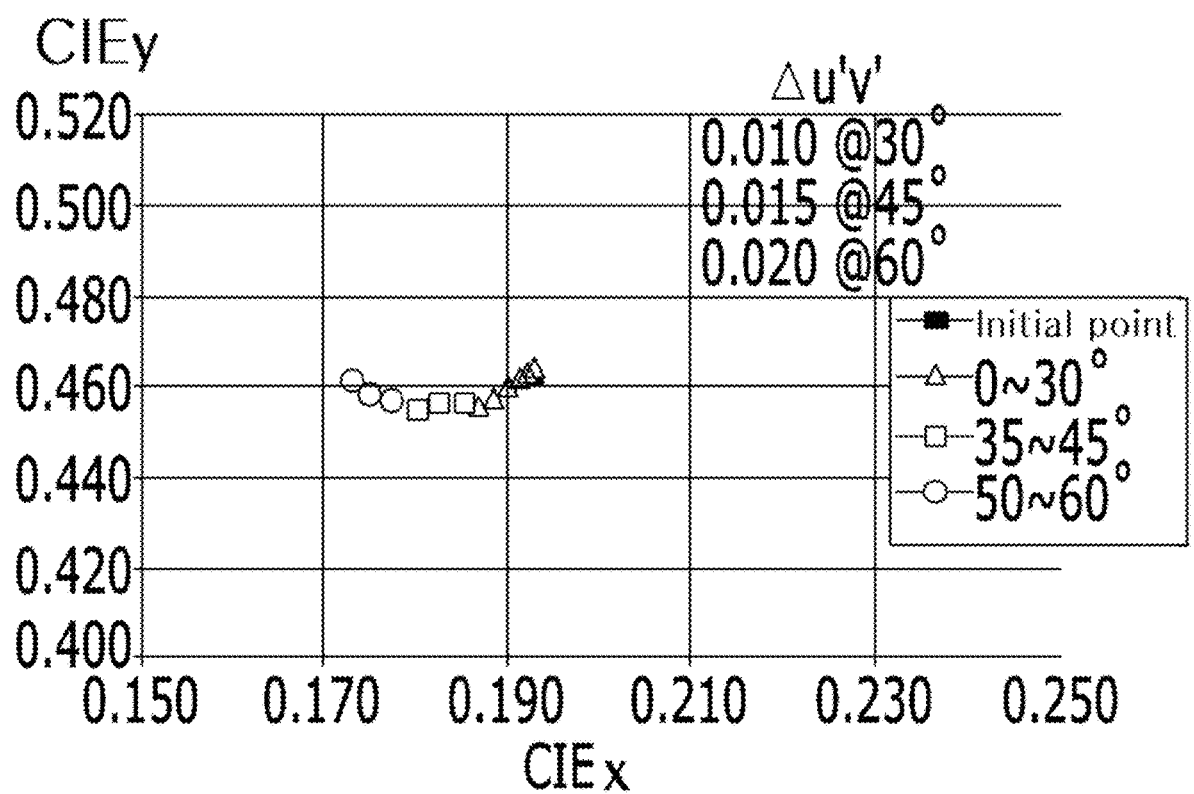
FIG. 11A to FIG. 11C are graphs illustrating changes in color viewing angles when full widths at half maximum ("FWHMs") of the green light-emitting layers are different.
Figure 11B:
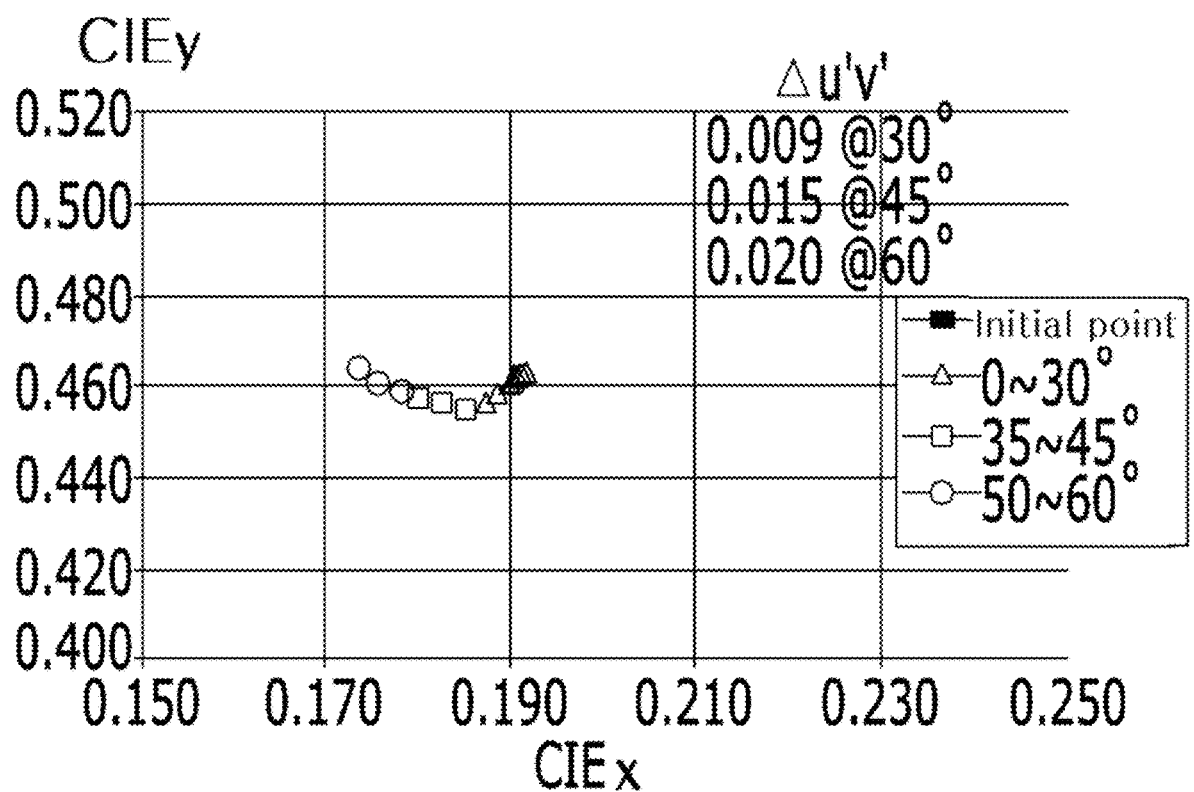
Figure 11C:
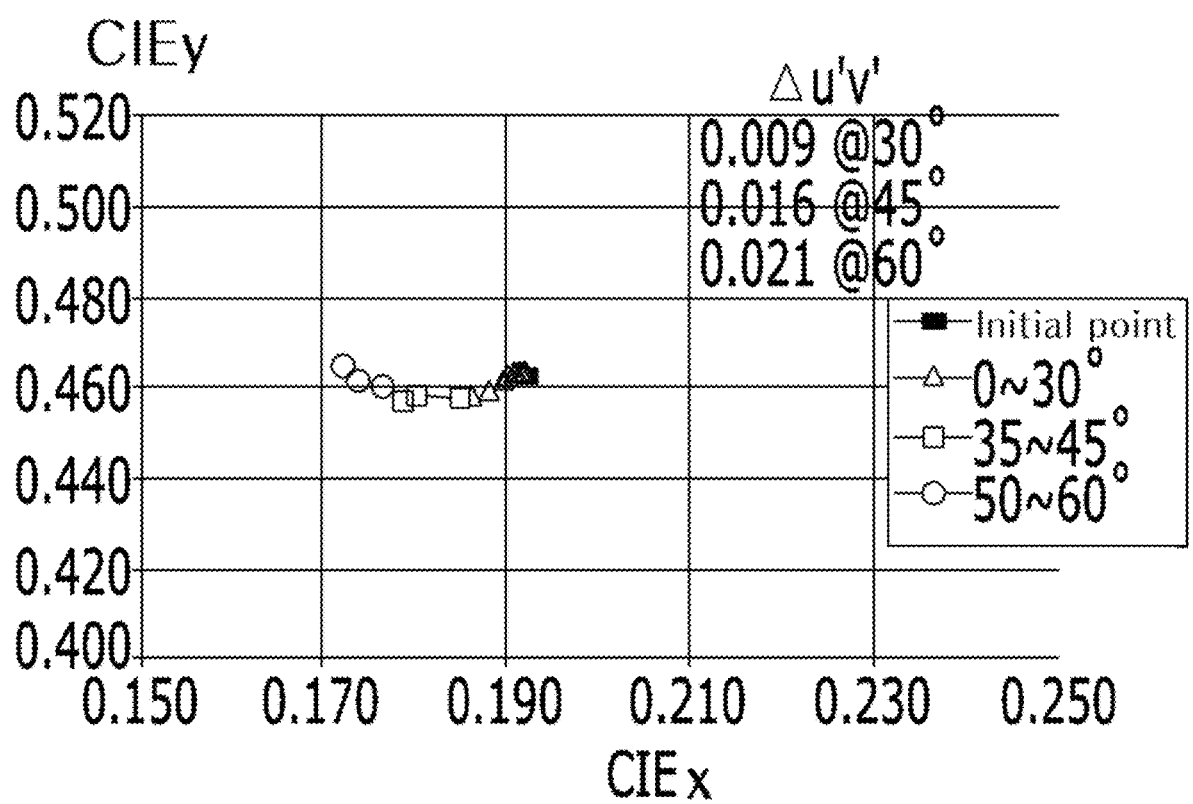

FIG. 11A to FIG. 11C are graphs illustrating changes in color viewing angles when full widths at half maximum ("FWHMs") of the green light-emitting layers are different.

FIGS. 11A to 11C respectively show color coordinate changes at viewing angles of 0° to 60° from the front of the light-emitting display device, in the cases that the dopant of the green light-emitting layer has a first FWHM (f), a second FWHM (f+5 nm), and a third FWHM (f+10 nm). The first FWHM f is, for example, 28.0 nm, which may be the same level as the first dopant in Table 1.

As shown in FIG. 11A, when the dopant of the green light-emitting layer has the FWHM f, the color coordinate deviation Δu'v' at a viewing angle of 30°, a viewing angle of 45°, and a viewing angle of 60° compared to a white front may be 0.010, 0.015, 0.020. As shown in FIG. 11B, when the dopant of the green light-emitting layer has the second FWHM (f+5 nm), the color coordinate deviation Δu'v' at a viewing angle of 30°, a viewing angle of 45°, and a viewing angle of 60° compared to a white front may be 0.009, 0.015, 0.020. As shown in FIG. 11C, when the dopant of the green light-emitting layer has the third FWHM (f+10 nm), the color coordinate deviation Δu'v' at a viewing angle of 30°, a viewing angle of 45°, and a viewing angle of 60° compared to a white front may be 0.009, 0.016, 0.021.

When the FWHMs are changed, the color coordinate deviation increases as the viewing angle increases according to the change in the viewing angle, and the color coordinate deviation values at each viewing angles in the structures having different FWHMs are similar. That is, it can be seen that the color coordinate deviation according to the change in the viewing angle may be similar regardless of the change in the FWHMs of the light-emitting layer.

Figure 12:
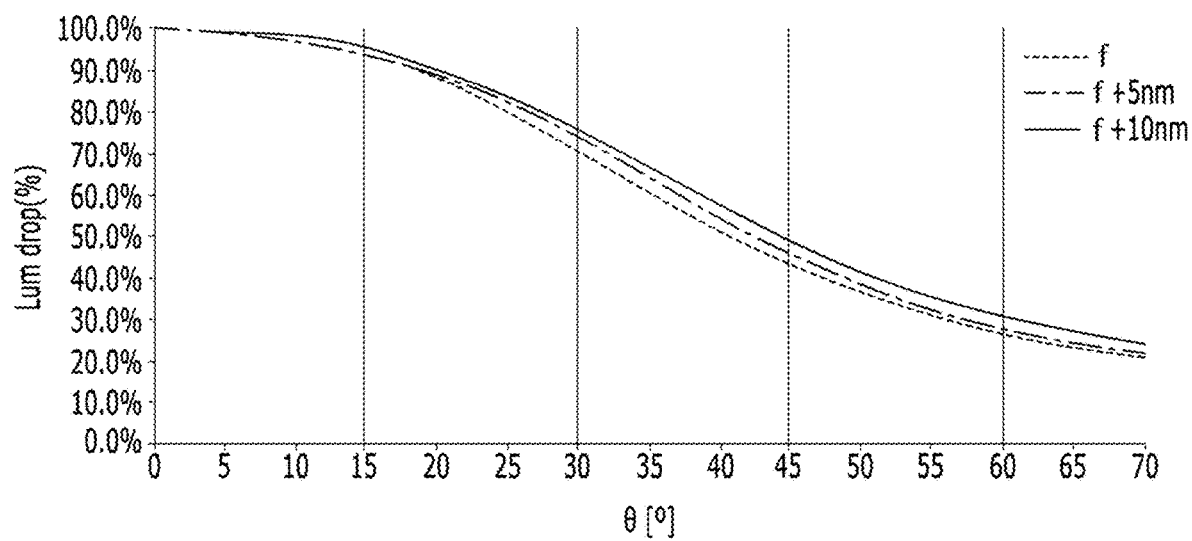
FIG. 12 is a graph illustrating a change in luminance when the FWHMs of the green light-emitting layers are different.

FIG. 12 is a graph illustrating a change in luminance when FWHMs of the green light-emitting layers are different.

TABLE 5

| | Luminance ratio to front luminance according to FWHMs | | |
|---|---|---|---|
| Viewing angle (Θ) | Luminance ratio (%)/at f | Luminance ratio (%)/ at f + 5 nm | Luminance ratio (%)/ at f + 10 nm |
| 15° | 94.1 | 95.1 (1% increase) | 95.8 (2% increase) |
| 30° | 70.7 | 73.7 (4% increase) | 75.7 (7% increase) |
| 45° | 43.3 | 46.0 (6% increase) | 48.9 (13% increase) |
| 60° | 26.7 | 27.9 (4% increase) | 30.6 (14% increase) |

In FIG. 11, it can be observed that value of the color coordinates according to the change in the viewing angle are similar regardless of the change in the FWHMs. In FIG. 12 and Table 5, it can be seen that the luminance improving effects at each viewing angle (as the viewing angle is increased) can be increased as increasing the FWHMs compared to the first FWHM f. It can be seen that, when the value of the FWHM is larger than the first FWHM f, the effect of improving the luminance ratio may be larger than the luminance ratio of the structure having the first FWHM f at the same viewing angle.

That is, in the light-emitting display device of the present disclosure, dopants having different electroluminescence characteristics may be applied to the light-emitting layers of the same series for each region. Thus, each light-emitting layer of the same series may realize front high luminous efficiency of inherent narrow strong cavity characteristic of each dopant, and the combination of the light-emitting layers having different electroluminescence characteristics may have a luminance improvement effect when a viewing angle is changed. Also, the light-emitting display device of the present disclosure has a significant effect in that it may have a luminance improvement without color deviation of white emission, regardless of the change of the viewing angles.

In a case of a plastic OLED device, a dopant having a micro-cavity effect and a narrow full width at half maximum (FWHM) may be used to realize a high efficiency. However, due to the narrow FWHM, when a single dopant is applied to a same color light-emitting layer, a decrease in luminance according to a viewing angle and dispersion of a color viewing angle may occur significantly. Thus, in the case of the plastic OLED device, due to the high micro-cavity effect, a luminance degradation according to a viewing angle may occur significantly, resulting in a luminance viewing angle defect.

It may be effective to widen an FWHM of the light-emitting layer to reduce a decrease in luminance according to the viewing angle. In the light-emitting display device of the present disclosure, two or more dopants having different EL values may be alternately deposited on adjacent same series pixels to realize a wide FWHM through overlapping and non-overlapping EL characteristics between two or more dopants, thereby solving luminance degradation.

To reduce luminance deterioration due to viewing angle due to an application of dopant having a narrow FWHM and a strong micro-cavity effect, two dopants with different EL characteristics may be alternately deposited to widen full width at half maximum ("FWHM"), to reduce luminance deterioration, and to solve defects as a viewing angle is changed.

In the light-emitting display device of the present disclosure, to realize a wide EL spectrum, the first dopant and the second dopant may be provided as dopants having a large difference of EL peaks in wavelength. That is, in the light-emitting display device of the present disclosure, in EML (R/GB) deposition processes of an OLED deposition process, chambers to form light-emitting layers R, G, and B and FMM masks can be additionally used, or the first dopant and the second dopant can be added by adding a shutter in the chamber. The chambers or shutters for the first dopant and the second dopant may be used for alternative rows, alternative columns or alternative diagonal lines, e.g., for alternative deposition. The first dopant and the second dopant can widen the FWHM of a light by the emission combination of the first and second light-emitting layers having the first and second dopants, thus reducing or preventing luminance degradation. Accordingly, decrease in luminance according to the viewing angle can be prevented or reduced, and a luminance viewing angle can be improved.

In the light-emitting display device of the present disclosure, sub-pixels of the same color may be divided into at least two or more regions, and different dopants may be applied to divided regions, so that the different dopants can extend the EL characteristics, thereby preventing or alleviating a decrease in luminance due to a change in the viewing angle. In addition, because different dopants of the same color series may be applied to different regions, the viewer may feel an effect of sub-pixels of different regions working together when viewing the light-emitting display device at a certain angle deviated from the front, and may obtain a luminance improvement effect according to an increase in the FWHM. Moreover, each of the sub-pixels of the same color may have narrow electroluminance characteristics of strong microcavity characteristics, so that the front luminance can be clearly maintained.

For this, the present disclosure according to one embodiment may include a light-emitting display device, including: a substrate including a first region and a second region spaced apart from each other, a first lower electrode at the first region, a second lower electrode at the second region, a first light-emitting layer having a first dopant on the first lower electrode of the first region, a second light-emitting layer on the second lower electrode of the second region, the second light-emitting layer having a second dopant different form the first dopant, the second light-emitting layer being configured to emit a light of a same color as that of the first light-emitting layer, and a common electrode on the first and second light-emitting layers, over the first and second regions.

In the light-emitting display device, an electroluminescence peak of the first dopant may have a difference from an electroluminescence peak of the second dopant of 1 nm to 40 nm or less in a wavelength. In the light-emitting display device, the first dopant and the second dopant may have different full widths at half maximum.

In the light-emitting display device, a first wavelength region, in which an electroluminescence intensity of the first dopant is 50% or more, and a second wavelength region, in which an electroluminescence intensity of the second dopant is 50% or more, may respectively have an overlapping region and a non-overlapping region. Also, a wavelength region, including the overlapping region and the non-overlapping region of the first and second wavelength regions, may be provided within 30 nm or more. In the light-emitting display device, at least one of the first dopant and the second dopant may have a full width at half maximum of less than 30 nm.

In the light-emitting display device, an electroluminescence intensity of the first dopant may be greater than that of the second dopant. Also, a full width at half maximum of the first dopant may be smaller than that of the second dopant. In the light-emitting display device, the first and second regions may be provided in alternating rows or alternating columns.

In the light-emitting display device, an electroluminescence peak of the first light-emitting layer may be at a wavelength range of 510 nm to 580 nm. The light-emitting display device may further include a third region between the first region and the second region on the substrate, the third region having a third light-emitting layer configured to emit a light of a different color from that of the first and second light-emitting layers.

The present disclosure according to one embodiment may include a light-emitting display device, including: a substrate, a first sub-pixel on the substrate, a second sub-pixel on the substrate, a third sub-pixel on the substrate, a fourth sub-pixel on the substrate, a first lower electrode to a fourth lower electrode respectively on the first to fourth sub pixels, a first light-emitting layer on the first lower electrode of the first sub-pixel, a second light-emitting layer on the second lower electrode of the second region, the second light-emitting layer having an electroluminescence peak wavelength that is 1 nm to 40 nm or less different from that of the first light-emitting layer, a third light-emitting layer and a fourth light-emitting layer respectively on the third lower electrode and the fourth lower electrode, each of the third and fourth emitting layers having an electroluminescence peak wavelength that is 50 nm or more different from the electroluminescence peak wavelengths of the first and second light-emitting layers, and a common electrode on the first to fourth light-emitting layers, commonly over the first to fourth sub-pixels.

In the light-emitting display device, a first wavelength region, in which an electroluminescence intensity of the first dopant is 50% or more, and a second wavelength region, in which an electroluminescence intensity of the second dopant is 50% or more, may respectively have an overlapping region and a non-overlapping region. Also, a wavelength region, including the overlapping region and the non-overlapping region of the first and second wavelength regions, may be provided within 30 nm or more.

In the light-emitting display device, the first sub-pixel, one of the third and fourth sub-pixels, and the second sub-pixel may be sequentially provided in parallel first to third lines. Also, the first to third lines may be along a column, a row, or a diagonal line.

In the light-emitting display device, the first light-emitting layer and the second light-emitting layer may be configured emit a light of a same color. Also, the first light-emitting layer may have a first dopant and the second light-emitting layer may have a second dopant, and the first and second dopants may have different emission peaks and different full widths at half maximum. In the light-emitting display device, at least one of the first dopant and the second dopant may have a full width at half maximum of less than 30 nm.

In the light-emitting display device, the electroluminescence peak wavelengths of the first and second light-emitting layers are 510 nm to 580 nm. The electroluminescence peak wavelength of the third light-emitting layer is 440 nm to 480 nm. The electroluminescence peak wavelength of the fourth light-emitting layer may be 605 nm to 645 nm.

In the light-emitting display device, a plurality of the first light-emitting layer may be provided between the first lower electrodes and the common electrode at the first sub-pixel. Also, a plurality of the second light-emitting layer may be provided between the second lower electrodes and the common electrode at the second sub-pixel.

In the light-emitting display device, each of the first to fourth lower electrodes may include a reflective electrode. Also, the common electrode may include a transparent electrode or a transflective electrode.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A light-emitting display device, comprising:
   a substrate comprising a first region and a second region spaced apart from each other;
   a first lower electrode at the first region;
   a second lower electrode at the second region;
   a first light-emitting layer having a first dopant on the first lower electrode of the first region and configured to emit a light;
   a second light-emitting layer on the second lower electrode of the second region, the second light-emitting layer having a second dopant different from the first dopant, the second light-emitting layer being configured to emit a light of a same color as the light of the first light-emitting layer; and
   a common electrode on the first and second light-emitting layers, over the first and second regions,
   wherein the second region does not include a light-emitting layer having the first dopant on the second lower electrode.

2. The light-emitting display device of claim 1, wherein an electroluminescence peak of the first dopant has a difference of 1 nm to 40 nm in wavelength from an electroluminescence peak of the second dopant.

3. The light-emitting display device of claim 1, wherein the first dopant and the second dopant have different full widths at half maximum.

4. The light-emitting display device of claim 1, wherein:
   a first wavelength region, in which an electroluminescence intensity of the first dopant is 50% or more, and a second wavelength region, in which an electroluminescence intensity of the second dopant is 50% or more, respectively have an overlapping region and a non-overlapping region; and
   a wavelength region, comprising the overlapping region and the non-overlapping region of the first and second wavelength regions, is provided within 30 nm or more.

5. The light-emitting display device of claim 4, wherein at least one of the first dopant and the second dopant has a full width at half maximum of less than 30 nm.

6. The light-emitting display device of claim 1, wherein:
   an electroluminescence intensity of the first dopant is greater than that of the second dopant; and
   a full width at half maximum of the first dopant is smaller than that of the second dopant.

7. The light-emitting display device of claim 1, wherein the first and second regions are provided in alternating rows or alternating columns.

8. The light-emitting display device of claim 1, wherein an electroluminescence peak of the first light-emitting layer is at a wavelength range of 510 nm to 580 nm.

9. The light-emitting display device of claim 7, further comprising a third region between the first region and the second region on the substrate, the third region having a third light-emitting layer configured to emit a light of a different color from that of the first and second light-emitting layers.

10. A light-emitting display device, comprising:
    a substrate;
    a first sub-pixel on the substrate;
    a second sub-pixel on the substrate;
    a third sub-pixel on the substrate;
    a fourth sub-pixel on the substrate;
    a first lower electrode to a fourth lower electrode respectively on the first to fourth sub-pixels;
    a first light-emitting layer on the first lower electrode of the first sub-pixel;
    a second light-emitting layer on the second lower electrode of the second region, and spaced apart from the first light-emitting layer, the second light-emitting layer having an electroluminescence peak wavelength that is different from an electroluminescence peak of the first light-emitting layer by 1 nm to 40 nm in wavelength;
    a third light-emitting layer and a fourth light-emitting layer respectively on the third lower electrode and the fourth lower electrode, each of the third and fourth emitting layers having an electroluminescence peak wavelength that is different from the electroluminescence peak wavelengths of the first and second light-emitting layers by 50 nm or more in wavelength;
    a hole blocking layer or an electron blocking layer on at least the first lower electrode and the second lower electrode; and
    a common electrode on the first to fourth light-emitting layers, commonly over the first to fourth sub-pixels,
    wherein the first light-emitting layer and the second light-emitting layer both directly contact the same hole blocking layer or both directly contact the same electron blocking layer.

11. The light-emitting display device of claim 10, wherein:

a first wavelength region, in which an electroluminescence intensity of the first dopant is 50% or more, and a second wavelength region, in which an electroluminescence intensity of the second dopant is 50% or more, respectively have an overlapping region and a non-overlapping region; and a wavelength region, comprising the overlapping region and the non-overlapping region of the first and second wavelength regions, is provided within 30 nm or more.

12. The light-emitting display device of claim 10, wherein:

the first sub-pixel, one of the third and fourth sub-pixels, and the second sub-pixel are sequentially provided in parallel first to third lines; and the first to third lines are along a column, a row, or a diagonal line.

13. The light-emitting display device of claim 10, wherein:

the first light-emitting layer and the second light-emitting layer are configured emit a light of a same color;

the first light-emitting layer has a first dopant and the second light-emitting layer has a second dopant; and the first and second dopants have different emission peaks and different full widths at half maximum.

14. The light-emitting display device of claim 13, wherein at least one of the first dopant and the second dopant has a full width at half maximum of less than 30 nm.

15. The light-emitting display device of claim 10, wherein:

the electroluminescence peak wavelengths of the first and second light-emitting layers are in a range from 510 nm to 580 nm;

the electroluminescence peak wavelength of the third light-emitting layer is in a range from 440 nm to 480 nm; and the electroluminescence peak wavelength of the fourth light-emitting layer is in a range from 605 nm to 645 nm.

16. The light-emitting display device of claim 10, wherein:

a plurality of the first light-emitting layer are provided between the first lower electrodes and the common electrode at the first sub-pixel; and a plurality of the second light-emitting layer are provided between the second lower electrodes and the common electrode at the second sub-pixel.

17. The light-emitting display device of claim 10, wherein:

each of the first to fourth lower electrodes comprises a reflective electrode; and the common electrode comprises a transparent electrode or a transflective electrode.

18. The light-emitting display device of claim 10, wherein:

the first light-emitting layer has a first dopant, the second light-emitting layer has a second dopant different from the first dopant, the first sub-pixel does not include a light-emitting layer having the second dopant on the first lower electrode, and the second sub-pixel does not include a light-emitting layer having the first dopant on the second lower electrode.

19. The light-emitting display device of claim 1, wherein:

the first region does not include a light-emitting layer having the second dopant on the first lower electrode, and the first light-emitting layer and the second light-emitting layer have a same host material.

20. The light-emitting display device of claim 1, further comprising:

a hole blocking layer or an electron blocking layer on the substrate in the first region and the second region, wherein the first light-emitting layer and the second light-emitting layer both directly contact the same hole blocking layer or both directly contact the same electron blocking layer.

* * * * *